United States Patent
Lee et al.

(10) Patent No.: US 9,019,764 B2
(45) Date of Patent: Apr. 28, 2015

(54) LOW-VOLTAGE PAGE BUFFER TO BE USED IN NVM DESIGN

(71) Applicant: Aplus Flash Technology, Inc., San Jose, CA (US)

(72) Inventors: Peter Wung Lee, Saratoga, CA (US); Hsing-Ya Tsao, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 58 days.

(21) Appl. No.: 13/680,286

(22) Filed: Nov. 19, 2012

(65) Prior Publication Data

US 2013/0128667 A1    May 23, 2013

Related U.S. Application Data

(60) Provisional application No. 61/629,409, filed on Nov. 18, 2011.

(51) Int. Cl.
*G11C 16/04* (2006.01)
*G11C 16/10* (2006.01)
G11C 16/16 (2006.01)
G11C 16/08 (2006.01)

(52) U.S. Cl.
CPC .............. *G11C 16/10* (2013.01); *G11C 16/16* (2013.01); *G11C 16/08* (2013.01); *G11C 16/0433* (2013.01); *G11C 16/0483* (2013.01)

(58) Field of Classification Search
CPC ......... G11C 16/08; G11C 16/10; G11C 16/16
USPC ............................ 365/185.11, 185.17, 185.24
See application file for complete search history.

(56) References Cited

U.S. PATENT DOCUMENTS

| | | | |
|---|---|---|---|
| 4,839,860 A * | 6/1989 | Shinoda et al. | 365/104 |
| 7,359,274 B2 * | 4/2008 | Noguchi et al. | 365/230.03 |
| 7,369,438 B2 | 5/2008 | Lee | |
| 7,529,137 B2 | 5/2009 | Lue et al. | |
| 7,551,477 B2 | 6/2009 | Mokhlesi et al. | |
| 8,120,959 B2 * | 2/2012 | Lee et al. | 365/185.13 |
| 8,233,320 B2 | 7/2012 | Lee et al. | |
| 2009/0310405 A1 | 12/2009 | Lee et al. | |
| 2010/0128522 A1 * | 5/2010 | Choi et al. | 365/185.2 |

OTHER PUBLICATIONS

PCT Search Report PCT/US 12/65734 Mailed: Feb. 5, 2013, APLUS Technology, Inc.

* cited by examiner

*Primary Examiner* — Connie Yoha
(74) *Attorney, Agent, or Firm* — Saile Ackerman LLC; Stephen B. Ackerman

(57) ABSTRACT

A low-current FN channel for Erase, Program, Program-Inhibit and Read operations is disclosed for any non-volatile memory using FN-tunneling scheme for program and erase operation, regardless NAND, NOR, and EEPROM and regardless PMOS or NMOS non-volatile cell type. As a result, all above NMV memories can use the disclosed LV, compact PGM buffer to replace the traditional HV PGM buffer for saving in the silicon area and power consumption. The page buffer is used to store new loaded data for new writing and to convert the stored data into the required BL HV voltage for either Erase or Program operations according to the stored data. In addition, the simpler on-chip State-machine design can be achieved with the superior quality of NVMs of this disclosure.

23 Claims, 26 Drawing Sheets

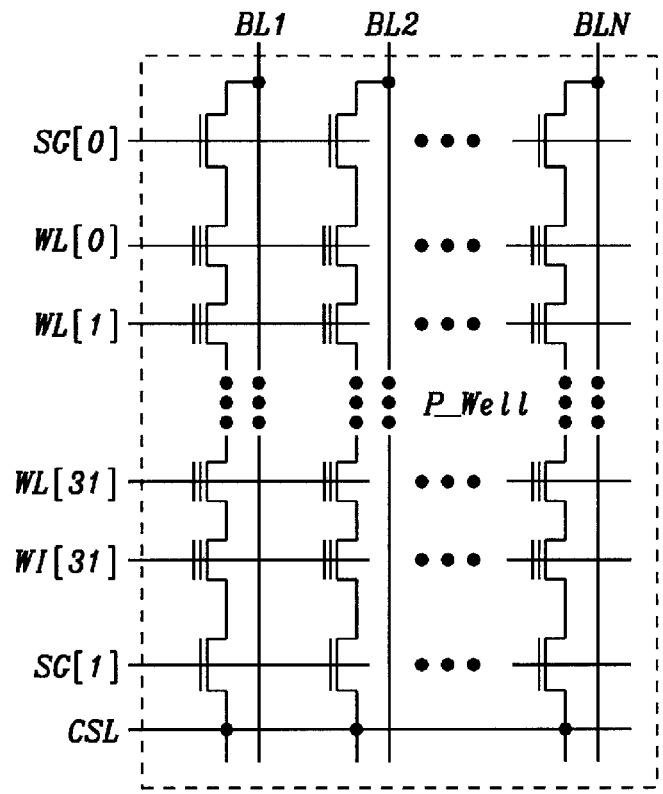
FIG. 1 – Prior Art
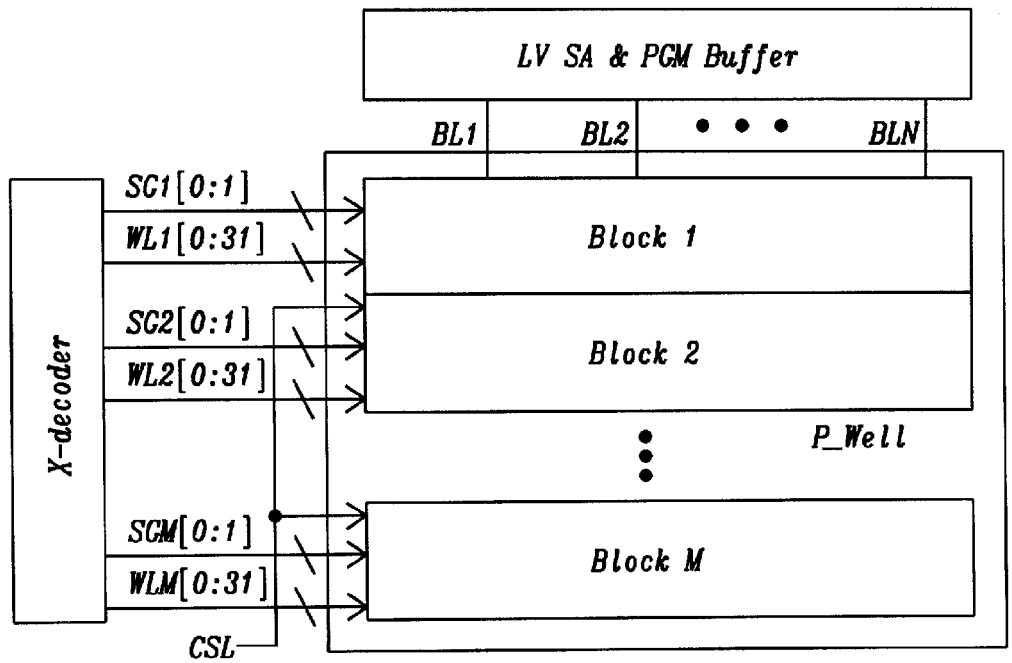
FIG. 2 – Prior Art

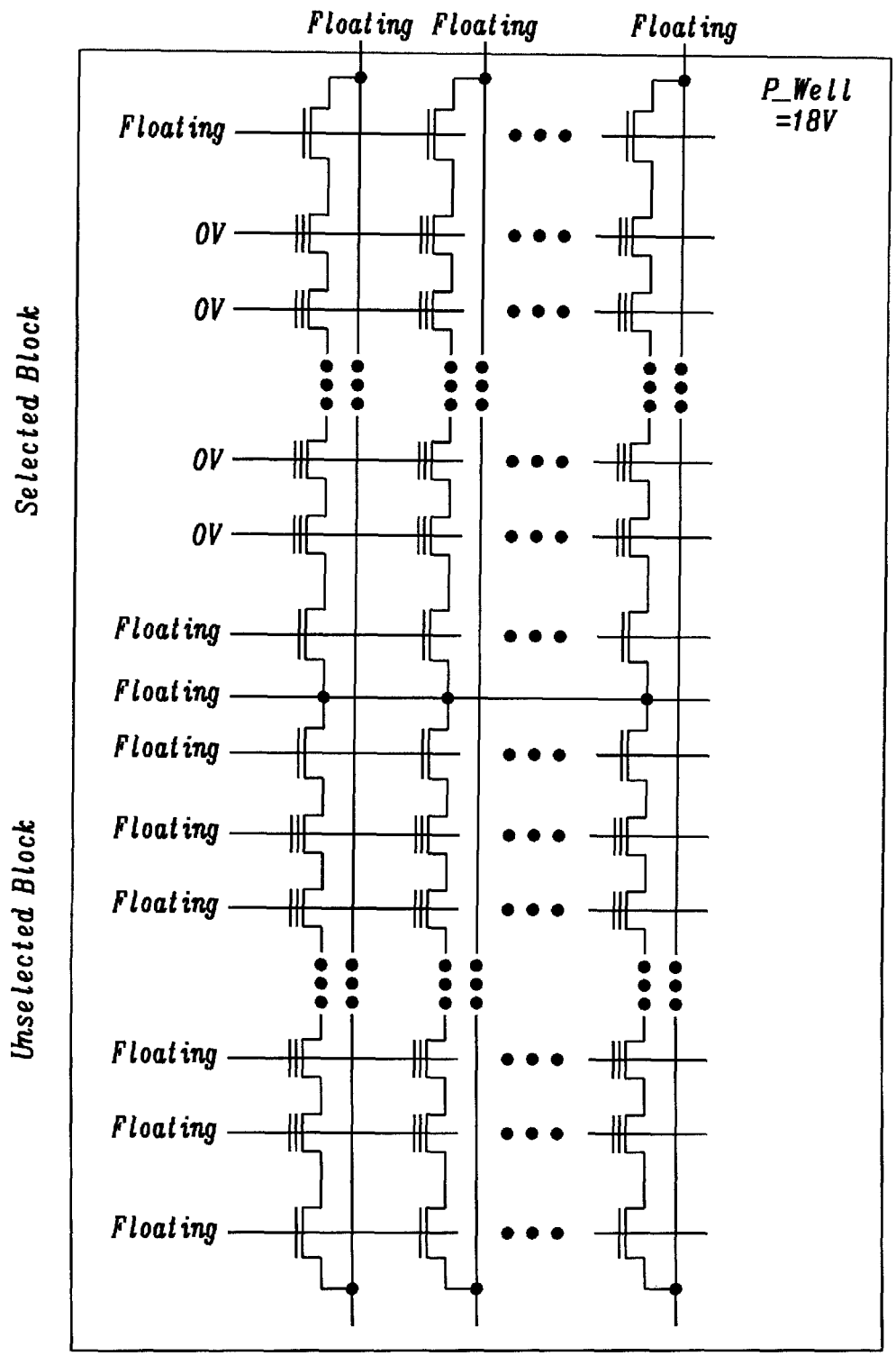
FIG. 5 - Prior Art

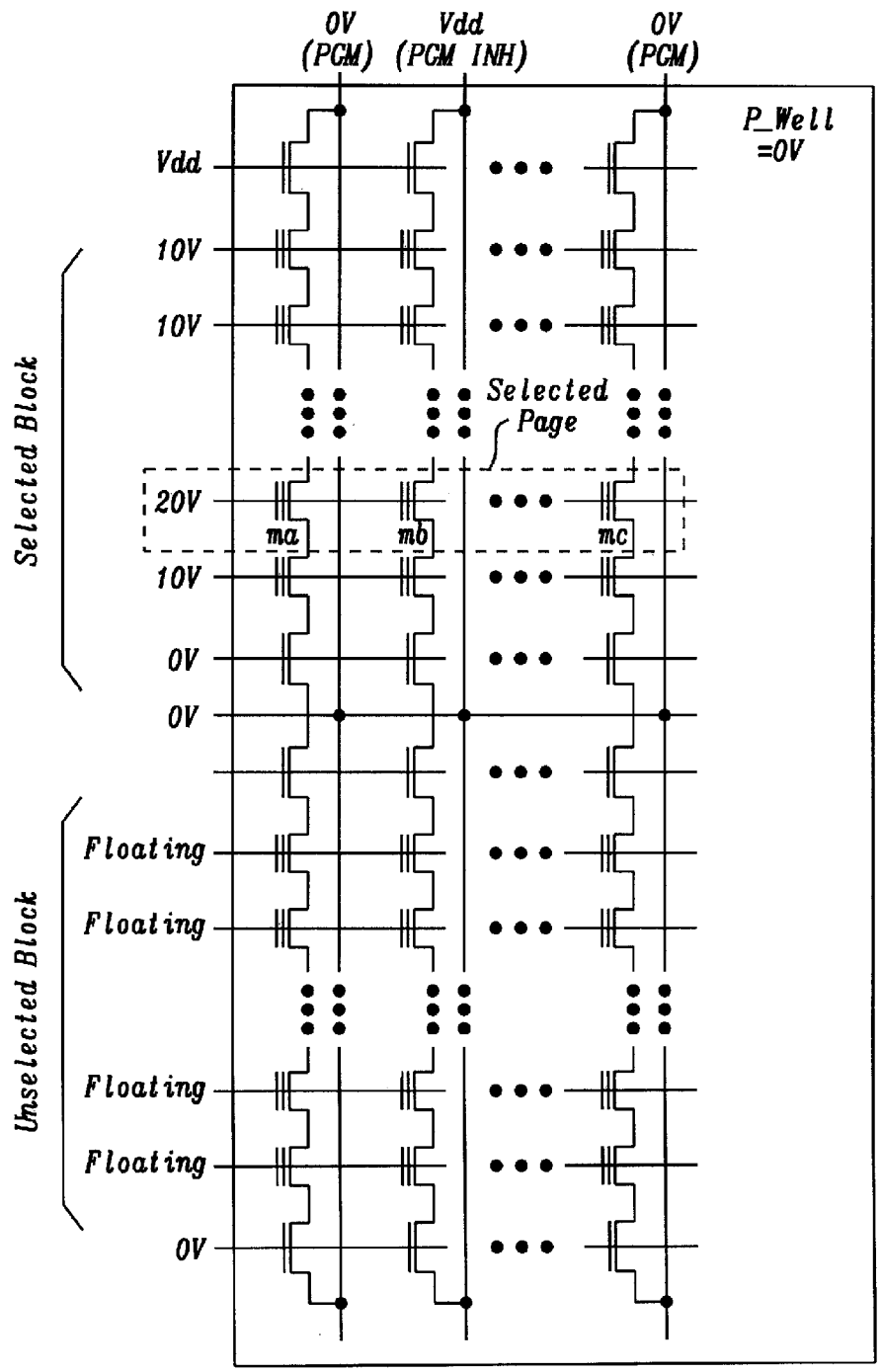
FIG. 7 – Prior Art

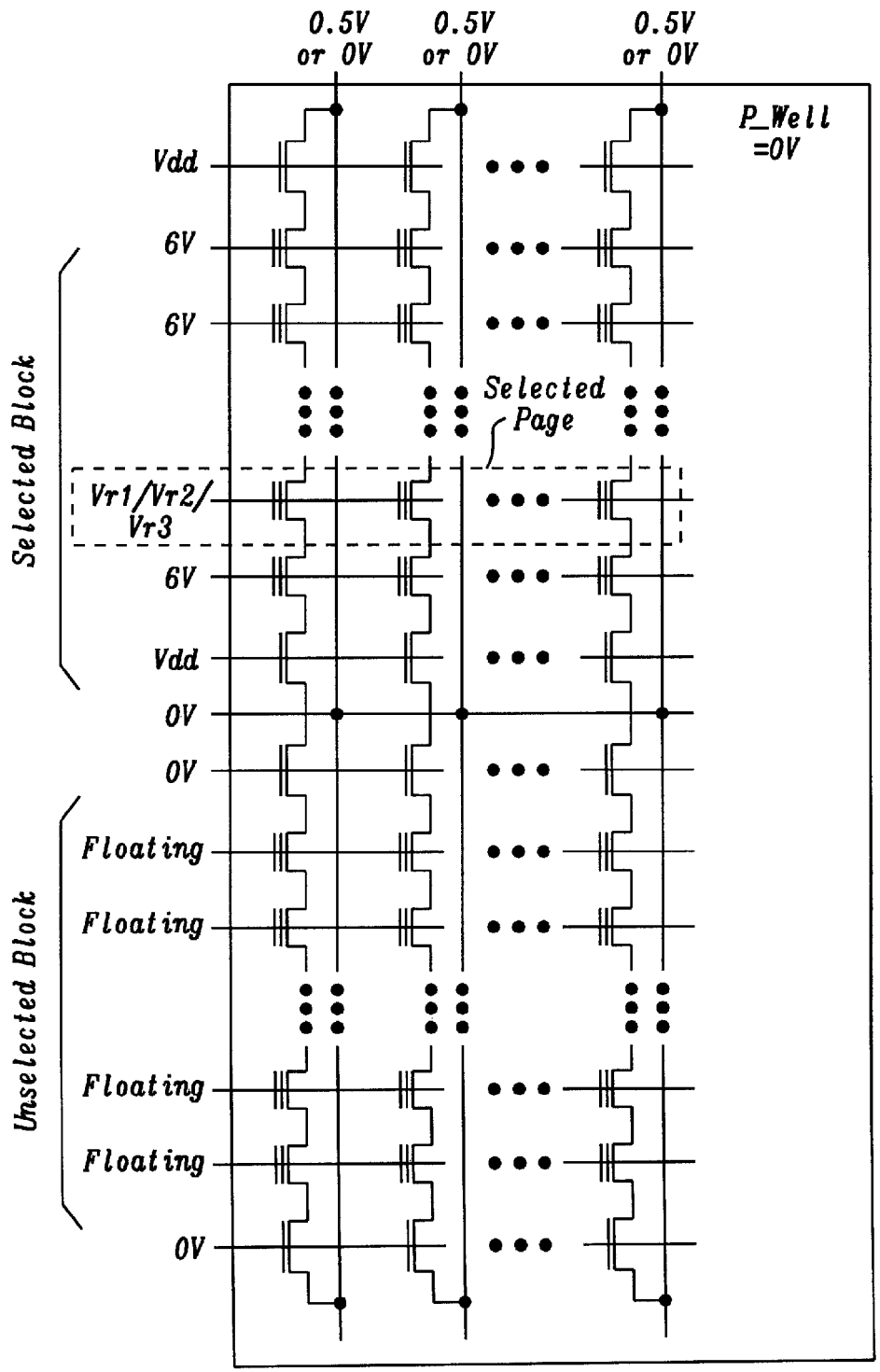
FIG. 9 - Prior Art

LOW-VOLTAGE PAGE BUFFER TO BE USED IN NVM DESIGN

This application claims priority of U.S. Provisional Application No. 61/629,409, filed Nov. 18, 2011, owned by a common owner of the instant application and which is herein incorporated by reference in its entirety.

BACKGROUND

1. Field of the Disclosure

This disclosure relates generally to high-voltage nonvolatile memory arrays and high-voltage page buffers. More specifically, this disclosure relates to the novel methods and apparatus for improving the operations of those popular NVM arrays with their cells employing the similar write scheme of high-voltage (HV) but low-current Fowler-Nordheim (FN) channel-erase and FN channel-program to allow using the very compact low-voltage (LV) page buffer and smaller HV charge-pump circuit for achieving drastic reduction in both die size and power consumption in write operation.

2. Description of Related Art

Nonvolatile memory (MVM) is well known in the art. For those NVMs that provide the repeatedly in-system or in-circuit electrically programmable and erasable functions today include the three major standalone NVMs such as EEPROM, NOR Non-volatile Memory, and NAND Non-volatile Memory plus one Embedded (em) Non-volatile memory that comprises of varied technologies.

The major NVM cell and the cell array structures and operations are all different. The mainstream NVMs of NAND, NOR, Embedded NOR and EEPROM bells are either made of 2-poly floating-gate NMOS or 1-poly charge-trapping NMOS storage devices. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

Currently, the mainstream standalone NAND and EEPROM NVMs in mass production are mainly based only the 2-poly floating-gate NMOS device. Both NAND and NOR NVMs designs are employing the HV, extremely low current FN channel-erase and FN channel-program.

But the NOR standalone non-volatile memory has two major kinds of the cell structures. One unique standalone NOR non-volatile design is using NMOS 1-poly charge-trapping cell by one single company such as Spansion. The remaining NOR non-volatile companies are using the similar 2-poly floating-gate NMOS cell in production today. These companies include a US company, Micron, and one company in Korea, Samsung, and two other Taiwanese companies such as Macronix and Winbond. As opposed to NAND non-volatile memory, both NOR non-volatile cells, regardless of 2-poly or 1-poly cell structures, are using the same high-current channel hot-electron (CHE) like EPROM cell for programming but using extremely low current FN channel for erasing operation.

For embedded NOR cells, there are also two kinds of cells. One is like the Silicon Storage Technology's (SST) Superflash split-gate cell that is using low-current CHE for program but extremely low current FN tunneling between top two Polys for erase operation. The cell structure and operating conditions are shown in Figures DD and SS.

The other two popular emFlash solutions are like NAND approaches employing both extremely low current scheme of the FN channel erase and FN channel program. These two companies are Infineon and Cypress semiconductor companies. Infineon approach is adopting the 2-poly floating-gate NAND-like, 1 T emFlash cell structure, while Cypress is using 1-poly, charge-trapping, 1-poly, NAND-like cell structure. The cell's circuit and operating conditions are shown in Figures of XX and YY.

For all above mentioned different NVMs and their associated with cells' operation conditions, erase is common using the extremely low current FN channel program, which is not the topic of this disclosure. This disclosure is fully focusing on those NVM cells and cell arrays that are employing the HV but extremely low current FN program operation. More particularly, the focus of this disclosure is to provide a novel approach for the fast and low-current program and program-inhibit operations so that the saving of the power consumption can be achieved. The invented approach of the present disclosure can be applied to all NMV cells that are using the extremely low current FN-channel erase and FN-channel program. These referred cells include today's mainstreamed Standalone NAND flash memory from Toshiba, Samsung, Micon and Hynix and the embedded Flash (emFlash) cells such as Infineon and Cypress, regardless of 1-poly or 2-poly cell, or PMOS or NMOS, 2D or 3D cell structures.

The reason that the Standalone NOR cells such as from Micron multi-level cell (MLC) ETOX cell, Spansion Mirrorbit cell and SST Superflash cell cannot be applied with this disclosure because they have a common issue of the conduction current between the cell's Drain-Source channel during the Program and Program-Inhibit operation. In extremely low current FN channel-erase and FN-channel program there is no conduction current between cell's drain-source channel, thus the cell array inhibit current in BLs or SLs can be eliminated; thus the program Inhibit operation can be normally operated without resulting any failure.

Further because this novel program and Program-Inhibit method, the traditional on-chip large, non-scalable HV page buffer can be replaced by a small, compact LV page buffer design for die size reduction. Furthermore, the traditional on-chip HV charge-pump must be active all the times during the program and program inhibit operations can only be needed in the beginning charge-up cycles and can be shut off for drastic power-saving.

SUMMARY OF THE DISCLOSURE

The $1^{st}$ object of this disclosure is to achieve for flash memories savings in silicon area and reduced power consumption.

The $2nd^t$ object of this disclosure is to provide a novel HV but low-current Program and Program-Inhibit method for operation of today's mainstreamed 2-poly floating-gate NAND flash memory array;

The 3rd object of this disclosure is to provide a novel HV but low-current Program and Program-Inhibit method for operation of a new NAND-based 2-poly floating-gate NOR flash memory array of the disclosure of same inventors of this disclosure;

The 4th object of this disclosure is to provide a novel HV but low-current Program and Program-Inhibit method for operation of the today's 2 T Flotox-based 2-poly floating-gate EEPROM memory array;

The 5th object of this disclosure is to provide a novel HV but low-current Program and Program-Inhibit method for operation of Infineon's 1 T NAND-like 2-poly floating-gate emFlash memory array;

The 6th object of this disclosure is to provide a novel HV but low-current Program and Program-Inhibit method for operation of the today's 2 T or 1 T low-voltage NAND-like 1-poly charge-trapping memory array, such as e.g. Cypress memory cells;

The 7th object of this disclosure is to provide a novel isolation method and apparatus in bit line (BL) or source line (SL) of the disclosed NVM array so that the retaining of the HV charges for the unselected program cells in the selected BL and WL can be secured without any voltage drop due to the elimination of the undesired coupling effect when the adjacent BLs and SLs are being discharged to ground for the selected Programmed cells. Thus, the normal Program and Program-Inhibit operations can be maintained.

The 8th object of this disclosure is to provide a novel isolation HV NMOS device in each divided BL and SL in each memory block so that the charges of the program-Inhibit HV in each selected BL and SL would be passed to the non-selected blocks. As a result, the Program-Inhibit charges need only to charge the small local BL and SL capacitance. As a result, the less driving-current, smaller charge-pump circuit Pump area can be achieved.

The 9th object of this disclosure is to provide the HV Program-Inhibit and program voltage charges and voltages from the above Divided BL and SL Isolation HV devices, rather than from the Page-buffer's multiple outputs which are connected to multiple BLs or SLs. As a result, the LV more compact and smaller Page-buffer can be used to replace the HV large Page-buffer of the present disclosure.

In accordance with the objects of the disclosure a method to achieve savings in silicon area and reduced power consumption for nonvolatile memories has been disclosed. The method disclosed comprises, comprising the following steps: (1) providing a memory array of non-volatile memory cells wherein said non-volatile memory cells use Fowler-Nordheim (FN)-tunneling for both program and erase operations and (2) enabling a low voltage (LV) page buffer by supplying a Program-Inhibit voltage (PIV) a from source line (SL) voltage.

In accordance with the objects of the disclosure a system to achieve savings in silicon area and reduced power consumption for nonvolatile memories has been achieved. The system disclosed comprises: a memory array of non-volatile memory cells wherein said non-volatile memory cells use Fowler-Nordheim (FN)-tunneling for both program and erase operations, and a low voltage (LV) page buffer configured to supplying a Program-Inhibit voltage (PIV) a from source line (SL) voltage.

To accomplish at least one of these objects, an embodiment includes a method of cell array operation and array memory division for the above mentioned NVMs to enable using the small LV page-buffer by strong, deep erasing erase and erase verifying, programming, and program verifying NVM memory cells.

A block of an array of the NVM memory cells is arranged in rows and columns. The block forms a sub-array of the array of NVM memory cells. Each of NOR flash memory cells is formed of two serially connected charge retaining transistors for flash or is formed of one charge-retaining NVMs and one non charge-retaining select transistor as seen in 2 T Flotox-based EEPROM.

A drain/source of a first of the two charge retaining transistors is connected to a local bit line and a source/drain of a second of the two charge retaining transistors connected to a local source line. The local bit line is connected to a global bit line through a bit line gating transistor and the local source line is connected to a global source line through a source line gating transistor. The control gates of each of the first charge retaining transistors on each row of NOR flash memory cells is connected to a word line. The control gates of the second charge retaining transistors on the row of NOR flash memory cells are connected to a separate word line. Each row of the first charge retaining transistors forms a first page set of the charge retaining transistors and each row of the second charge retaining transistors forms a second page set of the charge retaining transistors.

BRIEF DESCRIPTION OF THE DRAWINGS

FIG. 1 prior art is a schematic diagram of prior art of a typical NAND flash memory block comprising of N NAND strings. Each NAND string comprises 32 basic 2-poly floating-gate NMOS NAND transistors connected in series with two 1-poly NMOS Select-gate transistors located on both ends of the string. All NAND transistors in the same NAND block are formed on the same Triple P-Well within the same deep N-well on the common P-substrate with one common source line CSL and multiple separate N BLs and 32 WLs and two separate select gate (SG) lines.

FIG. 2 prior art is a schematic block diagram of prior art of a typical NAND flash memory chip comprising of M NAND memory blocks, X-decoder of left and the LV SA (Sense Amplifier) and LV PGM buffer (Program page buffer) situated on the array top. The detailed circuit of each block is seen in FIG. 1 prior art prior art. All M NAND memory blocks are formed on the same big TPW (Triple P-Well) within the same big DNW (deep N-well) on the common P-substrate with one common source line CSL and the multiple M sets of separate 32 WLs connected to the outputs of X-decoder and M sets of dual SG lines along with N BLs.

FIG. 5 prior art shows a typical set of preferable voltage biased conditions assigned to the WLs, BLs, CSLs and SGs, TPW and DNW of the Selected block and the remaining unselected blocks within a typical NAND memory Sector for the preferable FN channel Erase operation of the prior art.

FIG. 7 prior art shows a typical set of voltage biased conditions assigned to the WLs, BLs, CSLs and SGs, TPW and DNW of the Selected block and the remaining unselected blocks within a typical NAND memory Sector in the FN channel full Page-program operation of the prior art NAND array.

FIG. 9 prior art shows a typical set of preferable voltage biased conditions assigned to the WLs, BLs, CSLs and SGs, TPW and DNW of the Selected block and the remaining unselected blocks within a typical NAND memory Sector during the Read operation of the prior art.

The HiNOR array of the present disclosure is a typical NOR flash array that is based traditional NAND cell structure, NAND cell operating scheme and NAND flash technology. Thus HiNOR can have same superior scaling path like NAND over today's stack-gate based NOR flash.

Figure 13:
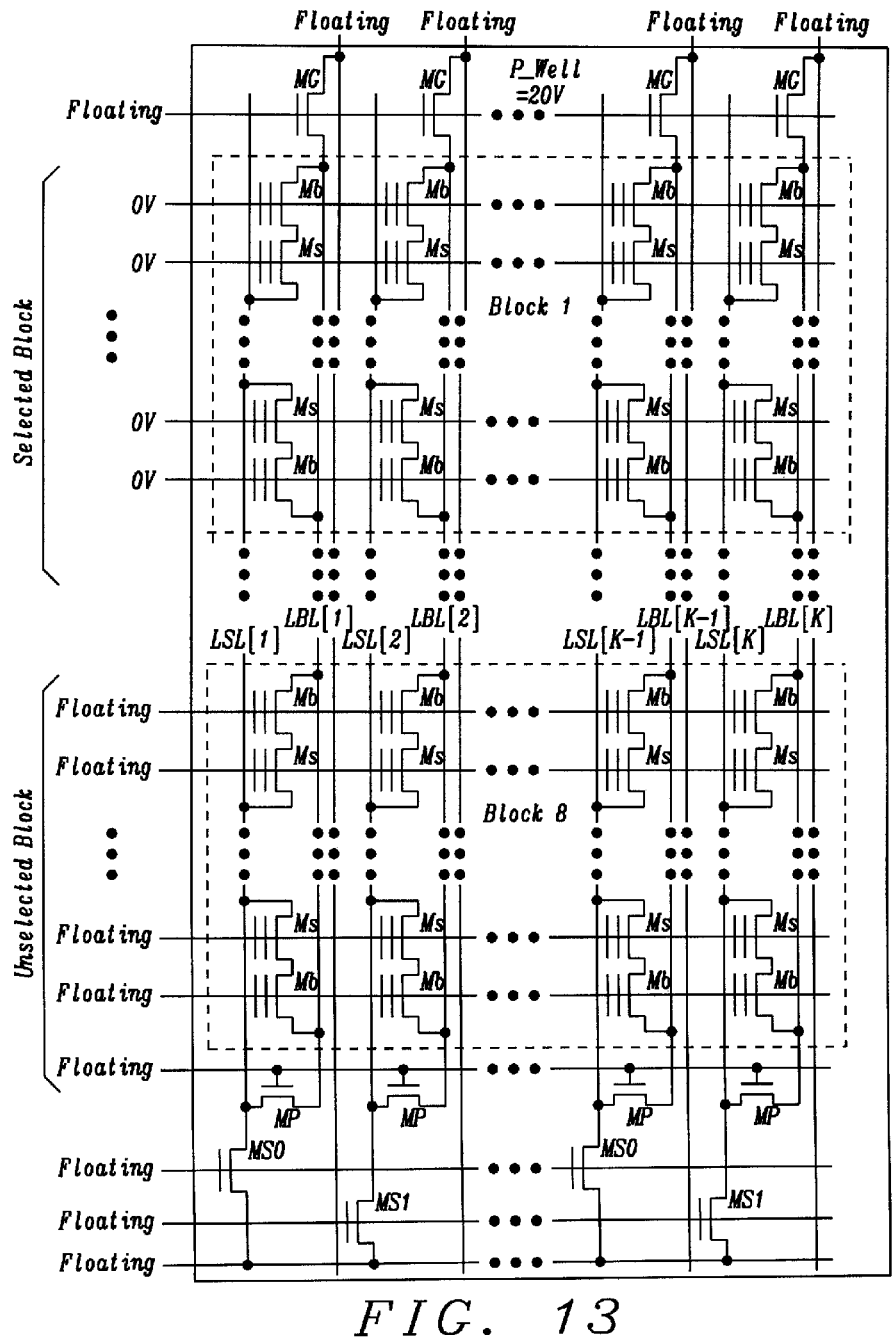

FIG. 13 shows a typical set of preferable voltage biased conditions assigned to the WLs, BLs, CSLs and SGs, TPW and DNW of the selected block and the remaining unselected blocks within a typical HiNOR memory Sector during similar FN channel erase operation like today's NAND of the present disclosure.

Figure 14A:
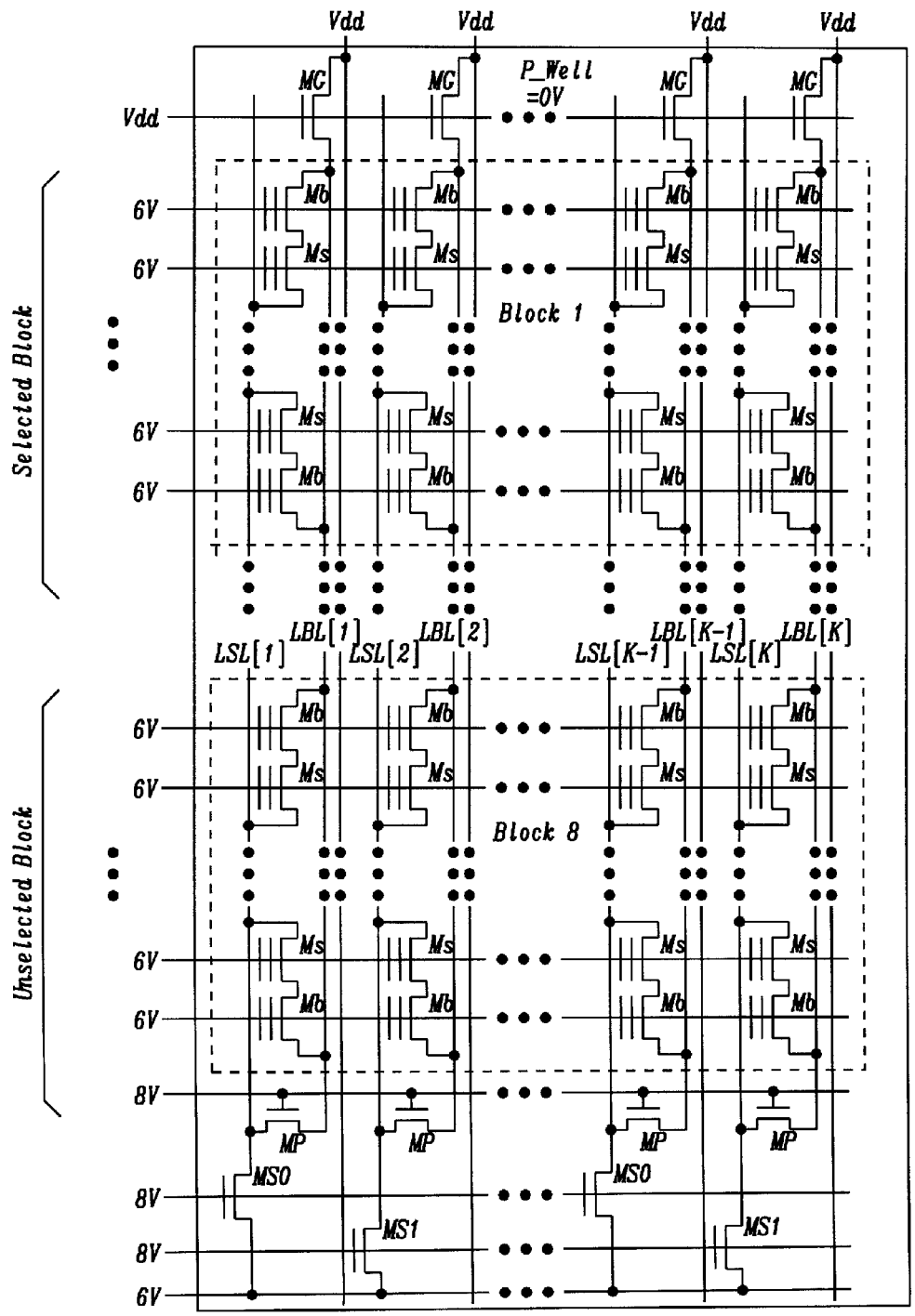

FIG. 14a shows a typical set of preferable voltage biased conditions assigned to the WLs, BLs, CSLs and SGs, TPW and DNW of the Selected block and the remaining unselected blocks within a typical HiNOR memory Sector during the $1^{st}$ cycle of the pre-charge period of the preferable half-page Program operation of the present disclosure.

Figure 14B:
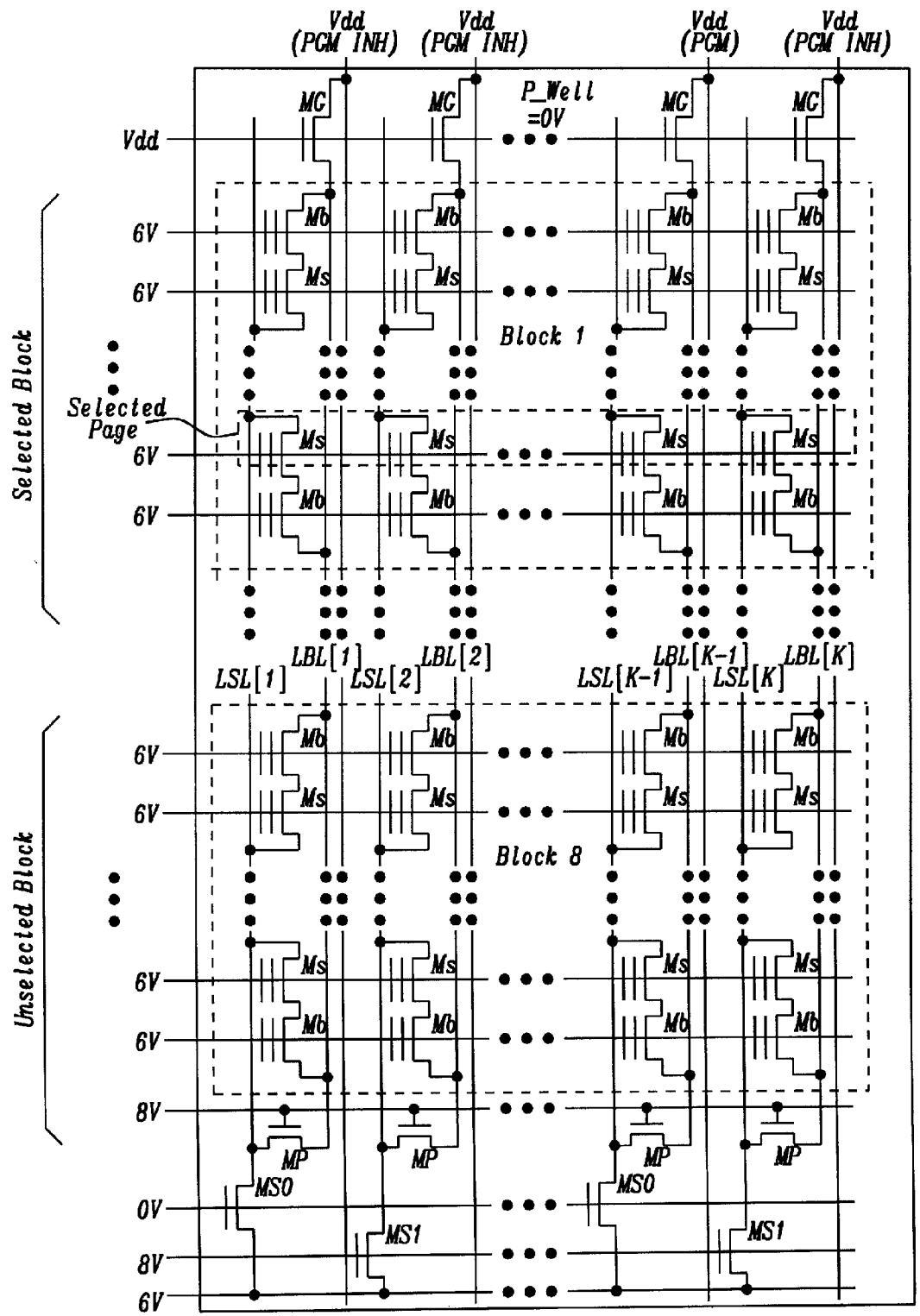

FIG. 14b shows a typical set of preferable voltage biased conditions assigned to the WLs, BLs, CSLs and SGs, TPW and DNW of the Selected block and the remaining unselected blocks within a typical HiNOR memory Sector during the $2^{nd}$ cycle of the Data settling period of the preferable half-page Program operation of the present disclosure.

Figure 14C:
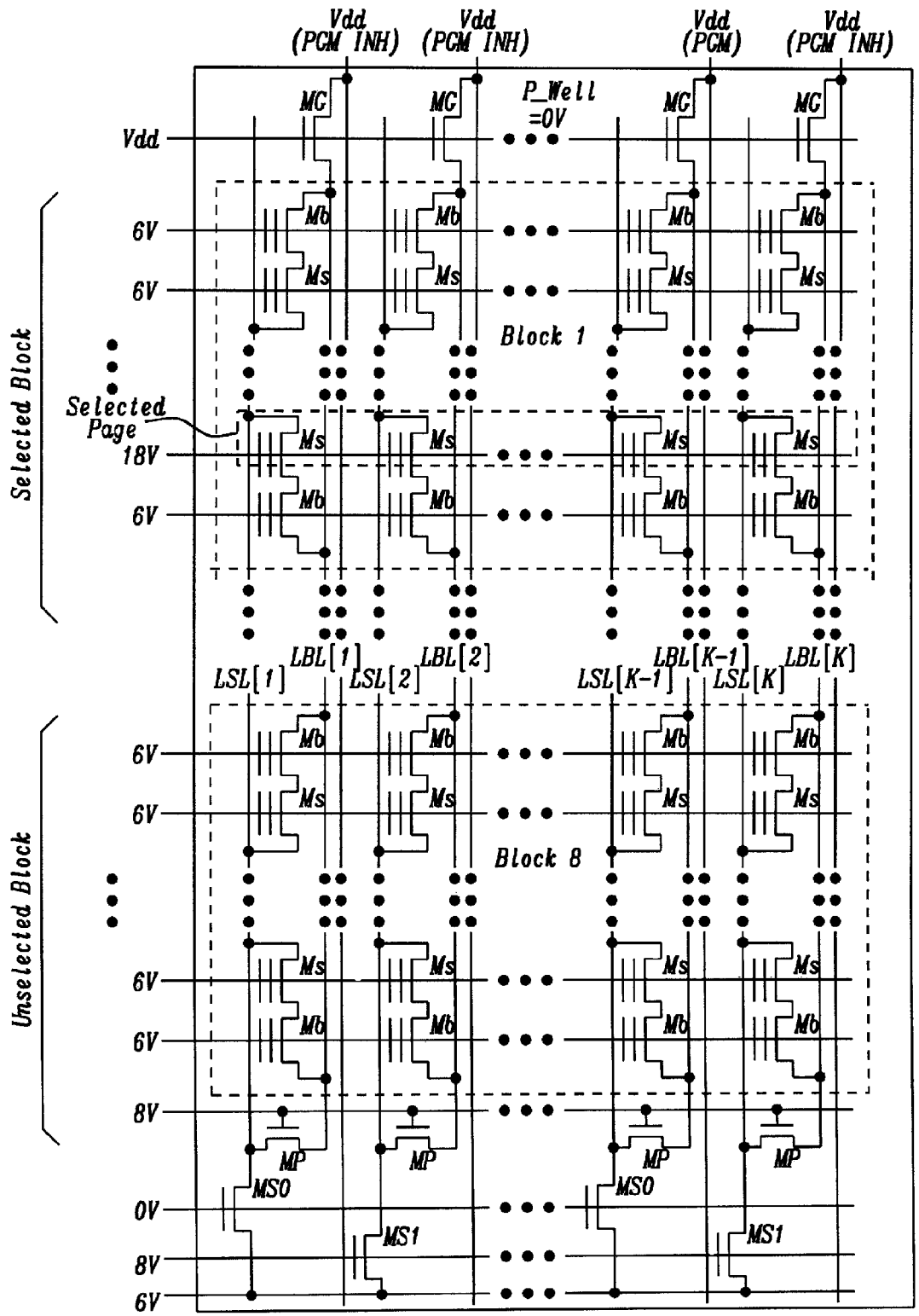

FIG. 14c shows a typical set of preferable voltage biased conditions assigned to the WLs, BLs, CSLs and SGs, TPW and DNW of the Selected block and the remaining unselected blocks within a typical HiNOR memory Sector during the $3^{rd}$ cycle of the Program period of the preferable half-page Program operation of the present disclosure.

Figure 15:
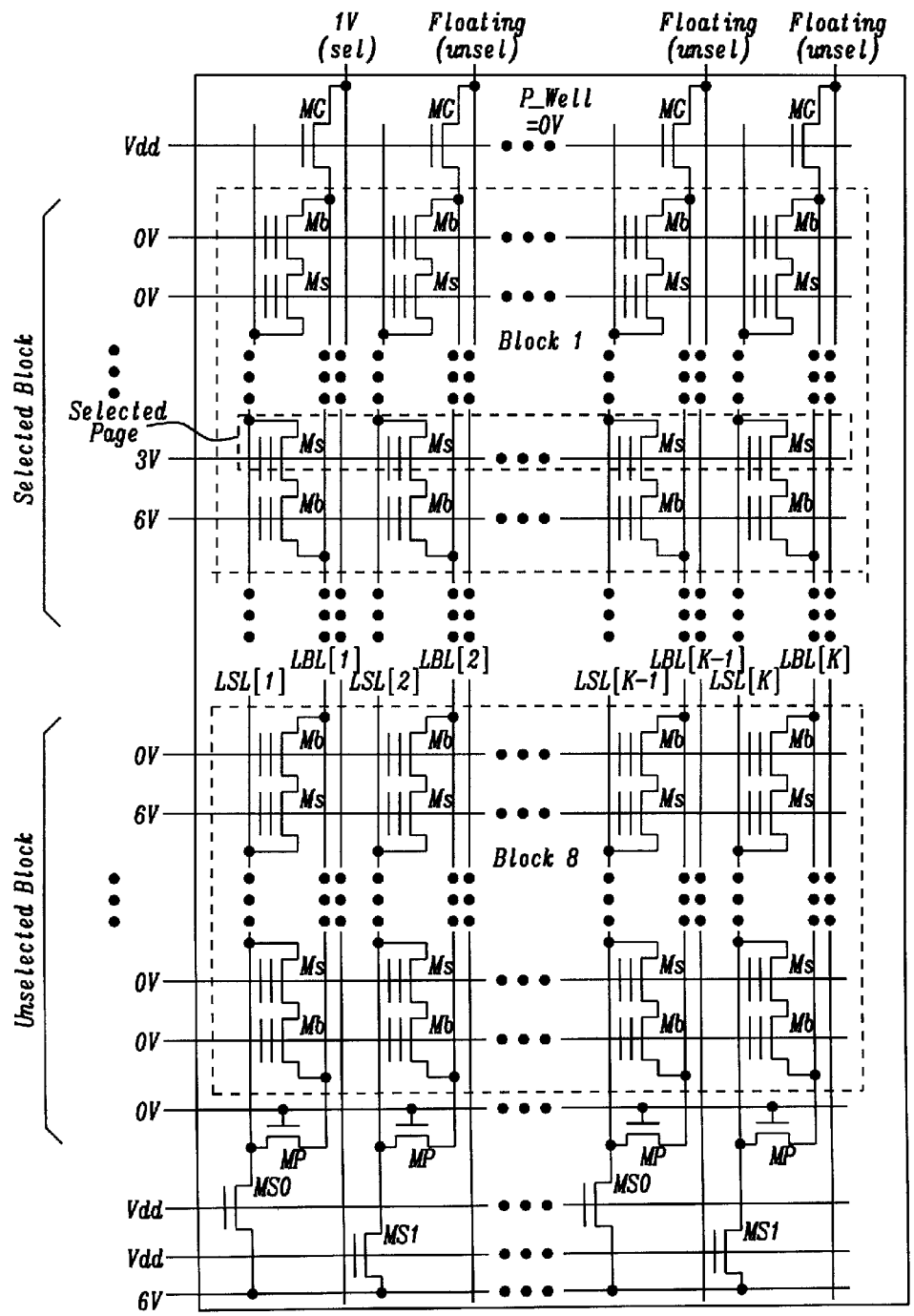

FIG. 15 shows a typical set of preferable voltage biased conditions assigned to the WLs, BLs, CSLs and SGs, TPW and DNW of the selected block and the remaining unselected blocks within a typical HiNOR memory Sector during the Read operation of the present disclosure.

Figure 16:
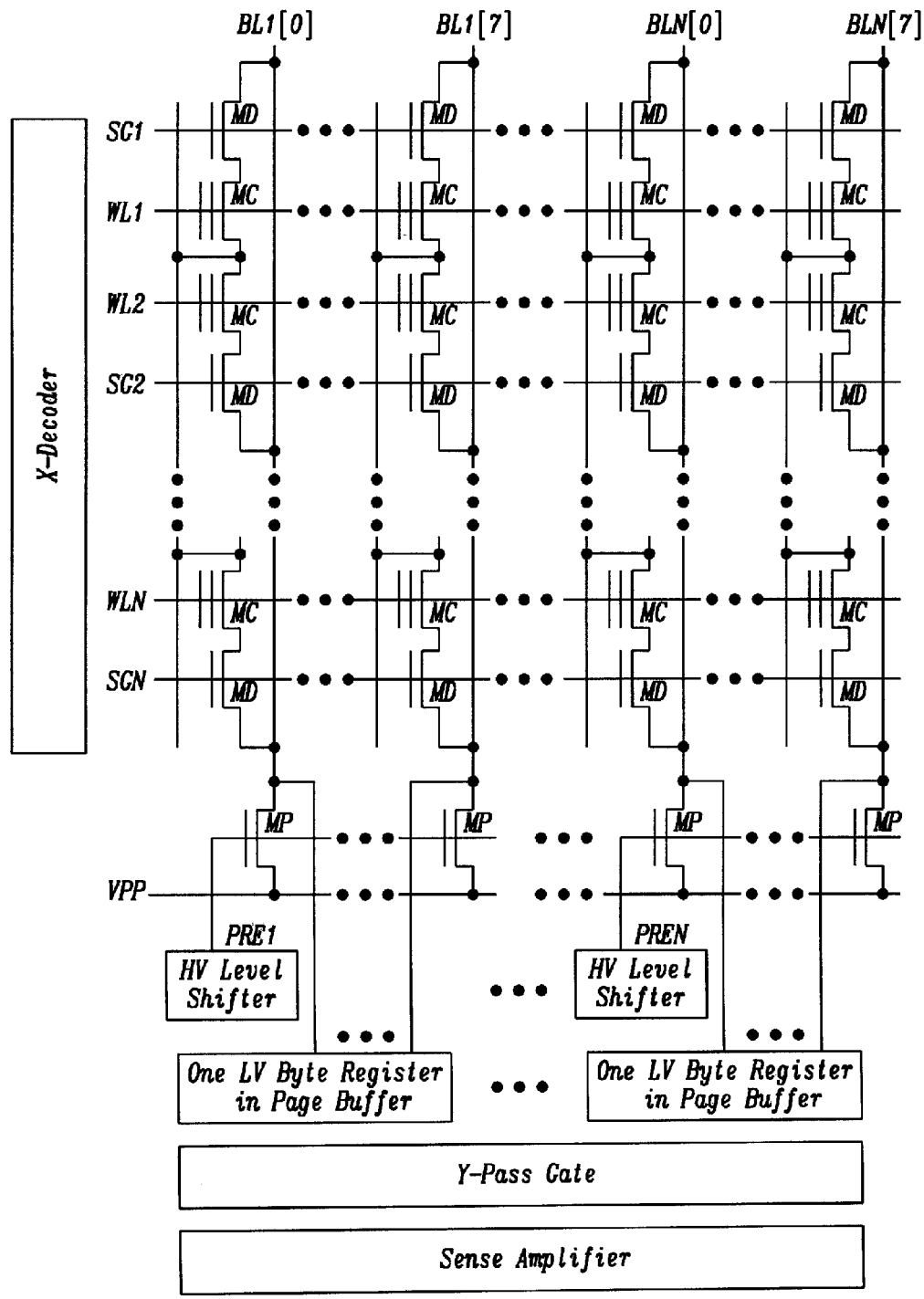

FIG. 16 shows a novel HiEE chip that comprises a plurality of 2 T Flotox-based EEPROM memory array circuit formed in matrix and is placed in the center, X-decoder placed at left, Y-pass Gate array and Sense Amplifiers and PGM page buffer of the present HiEE disclosure.

The key feature of HiEE technology is based on today's EEPROM process and cell structure without any change ensuring the full technology compatibility but has much superior scalability over today's EEPROM array. Like EEPROM cells and array, HiEE cells and array are formed on top of P-substrate, rather than on TPW within the DNW on the Psub as in the previous HiNAND and HiNOR arrays.

Figure 17:
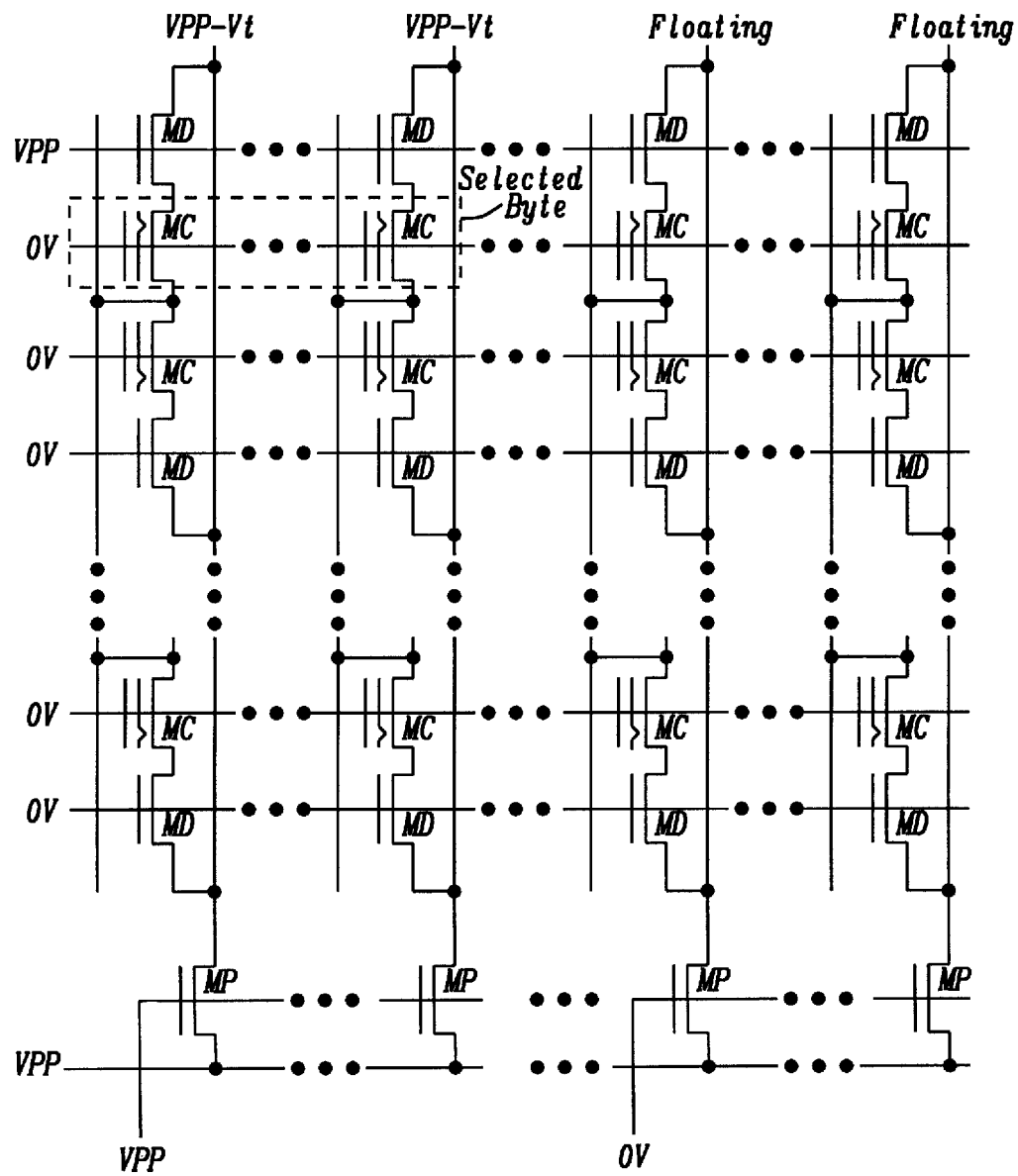

FIG. 17 shows a typical set of preferable voltage biased conditions assigned to the WLs, BLs, CSLs and SGs of the select and the remaining unselected EEPROM cells of a typical HiEE memory chip during the similar FN channel erase operation but is performed in units of byte of the present disclosure.

Figure 18:
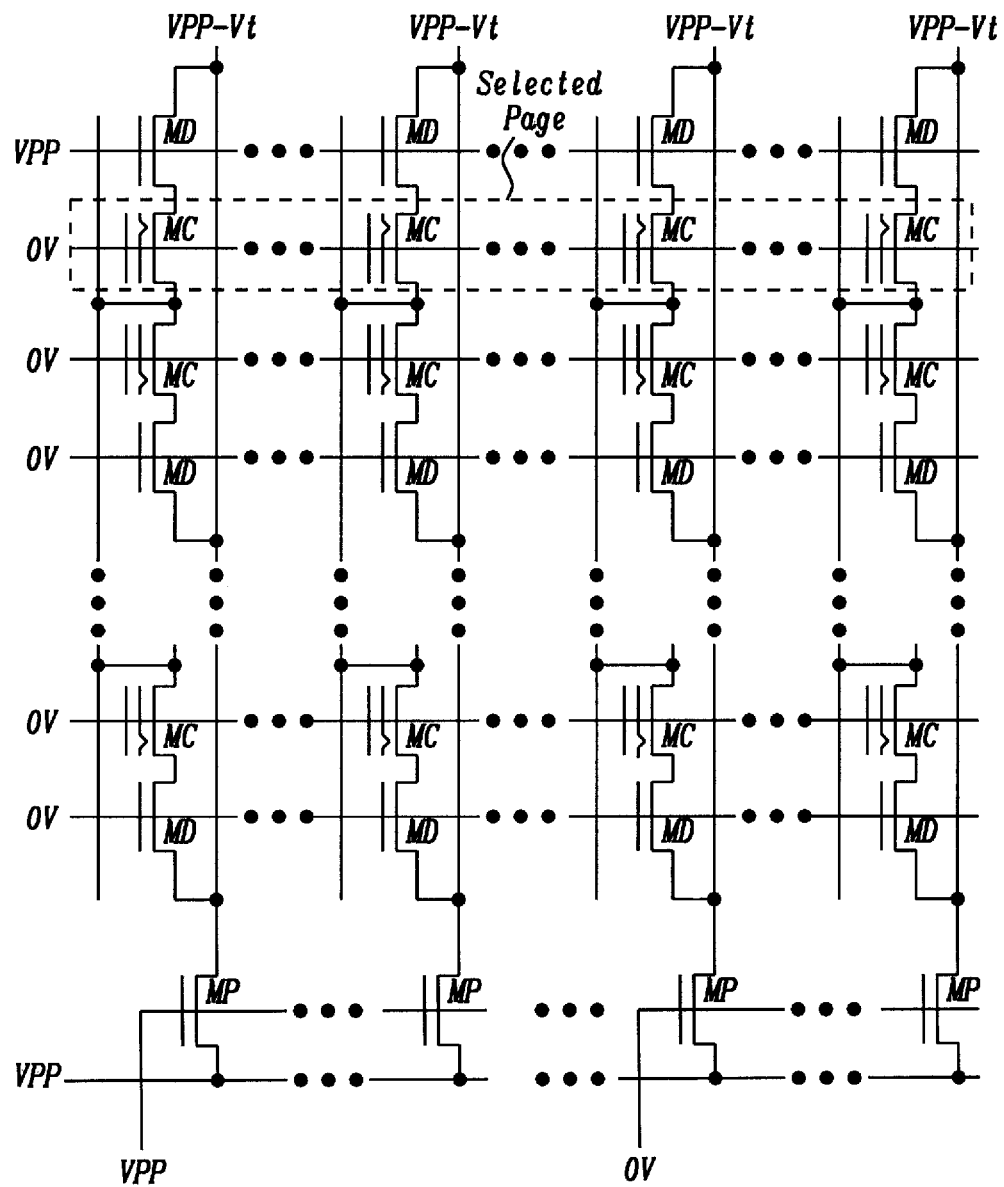

FIG. 18 shows a similar set of preferable voltage biased conditions assigned to the WLs, BLs, CSLs and SGs of the select and the remaining unselected EEPROM cells of a typical HiEE memory chip during the similar FN channel erase operation but is performed in units of page of the present disclosure.

Figure 19:
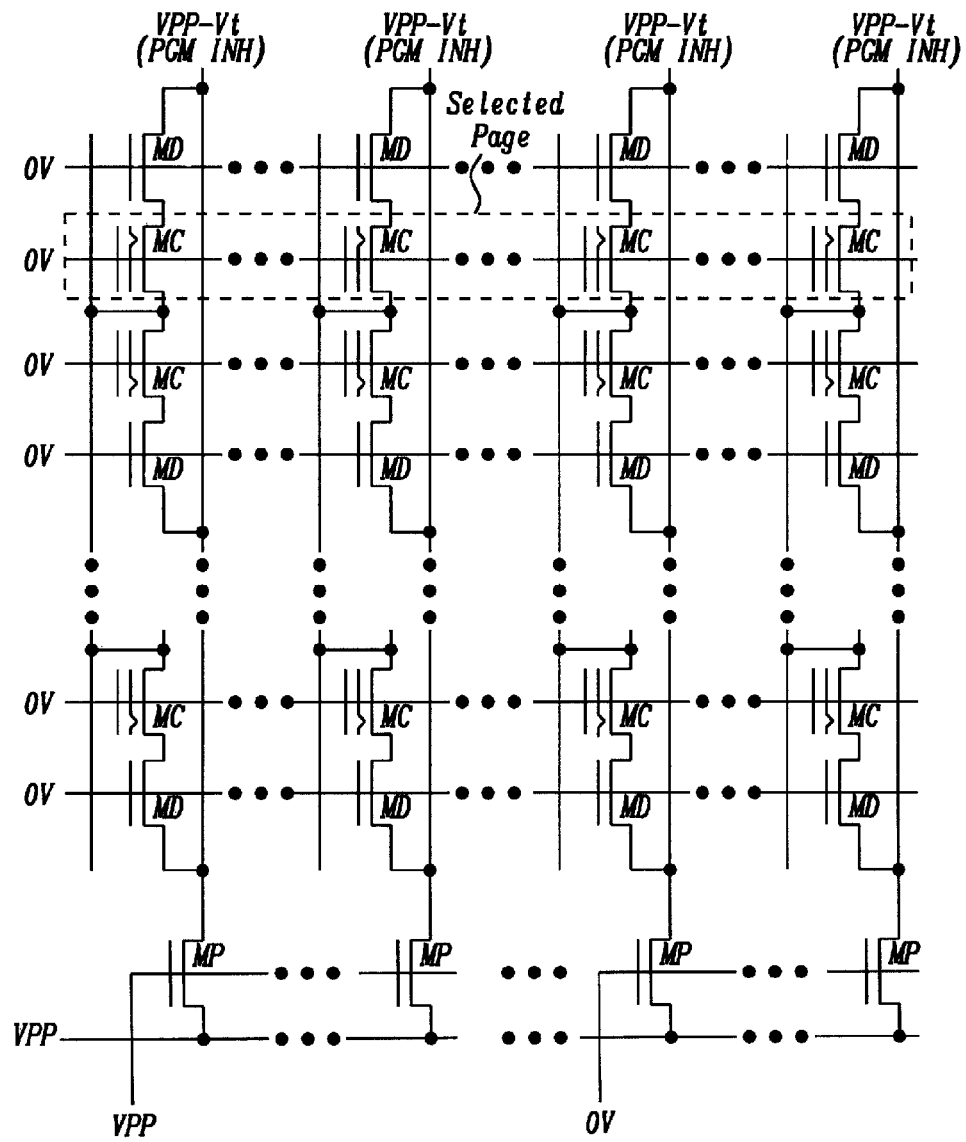

FIG. 19 shows a similar set of preferable voltage biased conditions of $1^{st}$ program cycle of Pre-charge period assigned to the WLs, BLs, CSLs and SGs of the select and the remaining unselected EEPROM cells of a typical HiEE memory chip during the similar FN channel program operation but is performed in units of half-page of the present disclosure.

Figure 20:
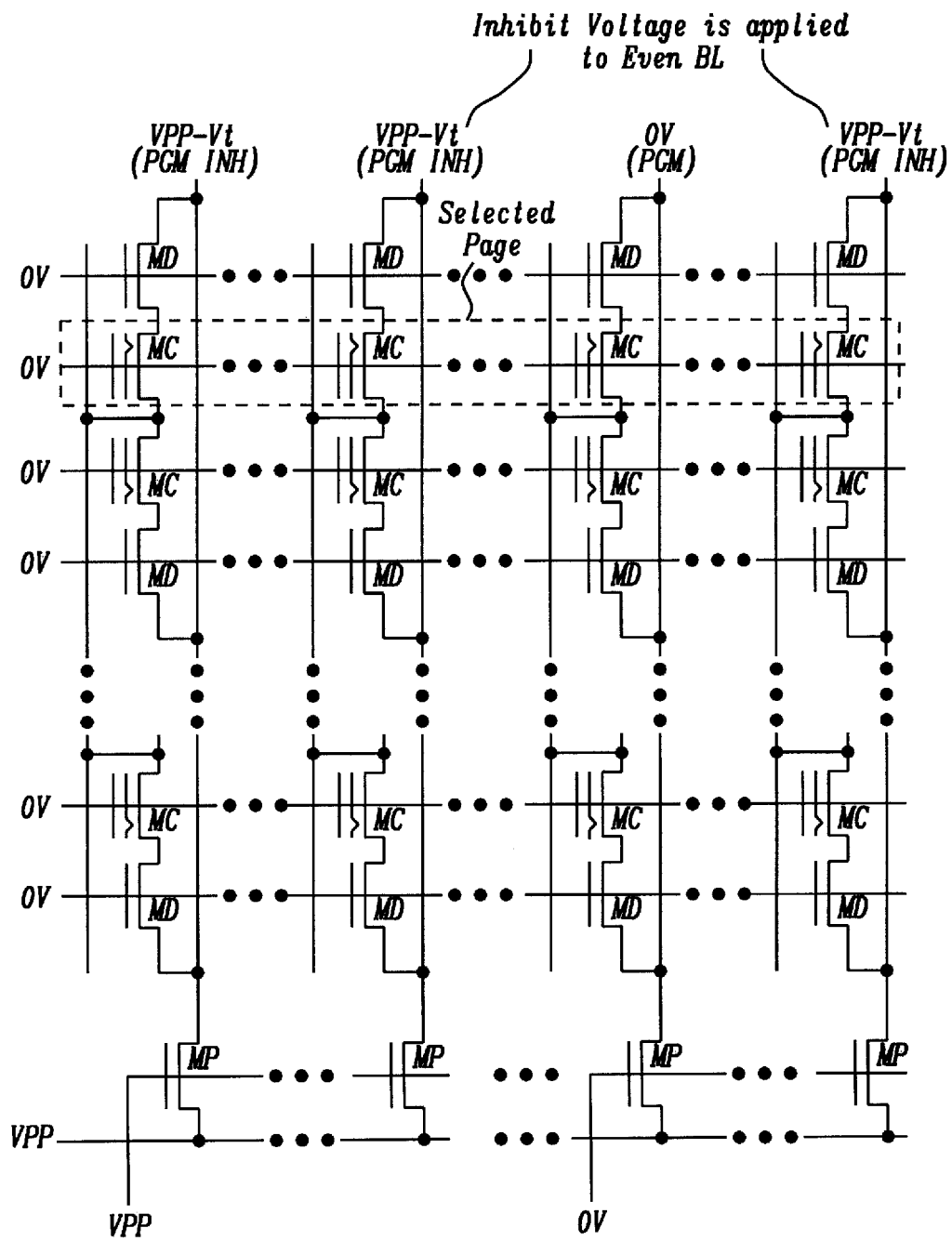

FIG. 20 shows a similar set of preferable voltage biased conditions of $2^{nd}$ program cycle of Data-setting period assigned to the WLs, BLs, CSLs and SGs of the select and the remaining unselected EEPROM cells of a typical HiEE memory chip during the similar FN channel program operation but is performed in units of half-page of the present disclosure.

Figure 21:
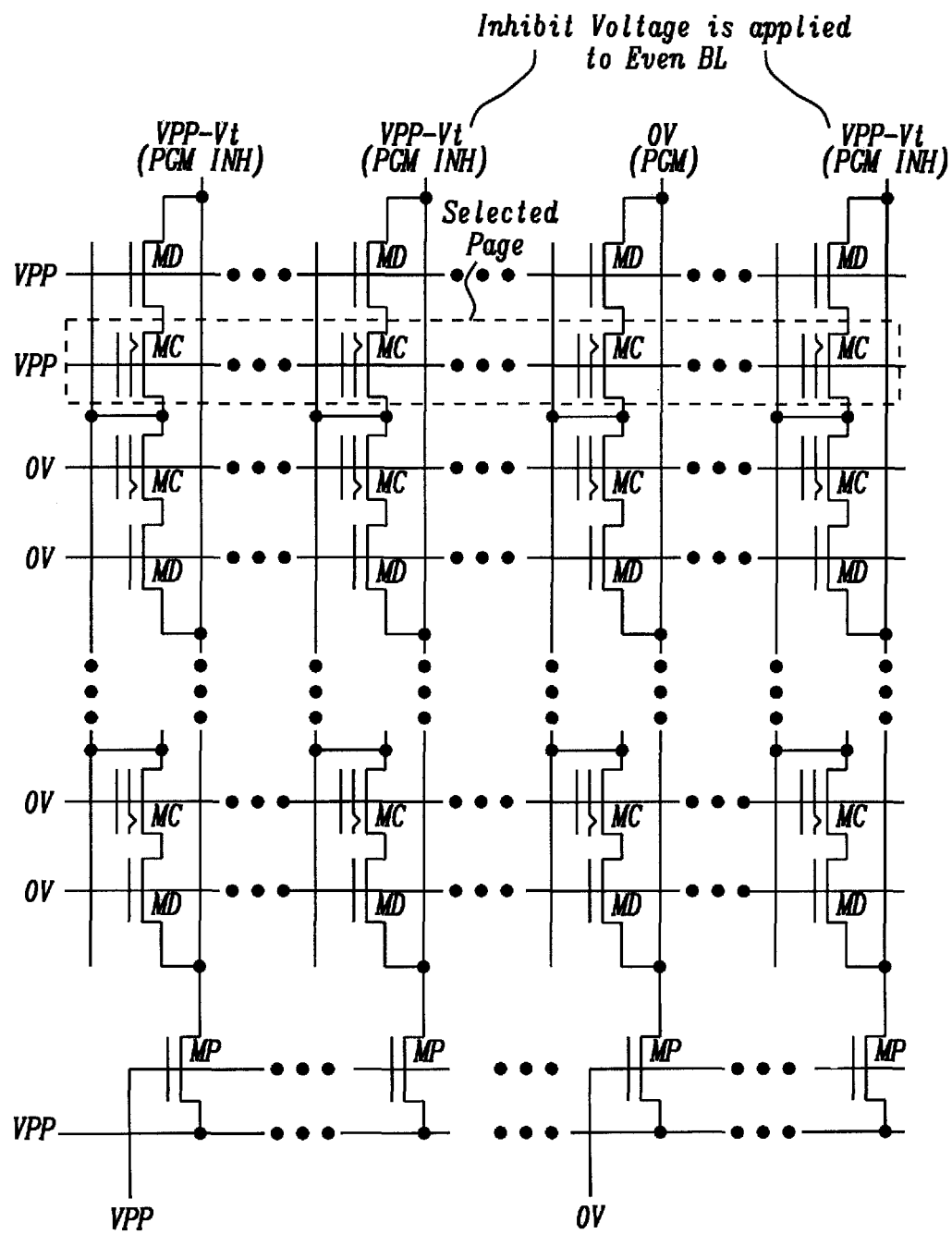

FIG. 21 shows a similar set of preferable voltage biased conditions of $3^{rd}$ program cycle of Programming period assigned to the WLs, BLs, CSLs and SGs of the select and the remaining unselected EEPROM cells of a typical HiEE memory chip during the similar FN channel program operation but is performed in units of half-page of the present disclosure.

Figure 22:
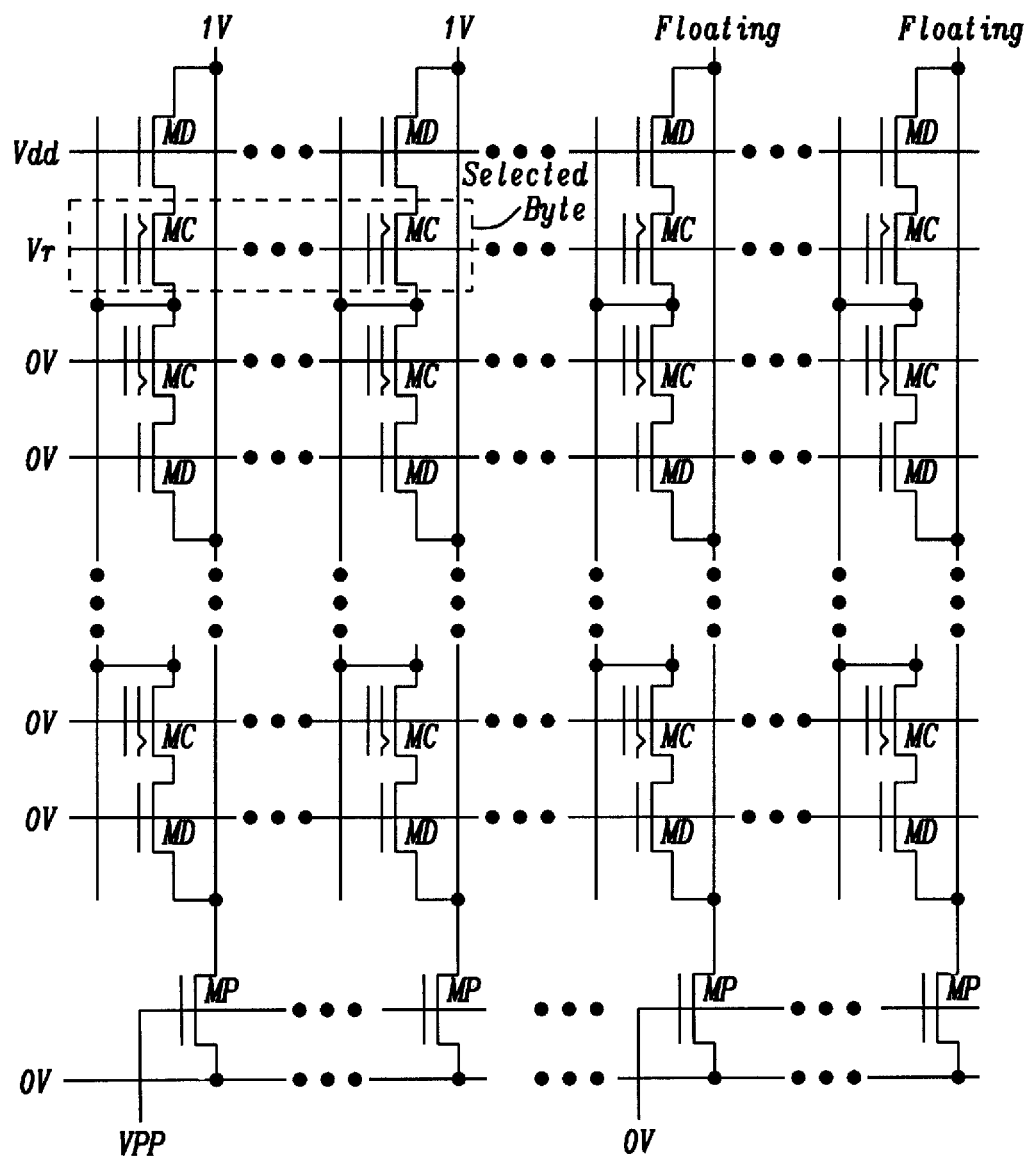

FIG. 22 shows a similar set of preferable voltage biased conditions of $3^{rd}$ program cycle of Programming period assigned to the WLs, BLs, CSLs and SGs of the select and the remaining unselected EEPROM cells of a typical HiEE memory chip during the similar Read operation but is performed byte of the present disclosure.

DETAILED DESCRIPTION OF THE DISCLOSURE

FIG. 1 is a schematic diagram of prior art of a typical NAND flash memory block that is comprised of N NAND strings. Each NAND string comprises 32 basic 2-poly floating-gate NMOS NAND storage transistors connected in series with two 1-poly HV NMOS Select-gate transistors located on both ends of the string.

Each string has total 34 transistors but has only 32-bit storage capacity. The top drain node of each string is connected to a tight metal1 layer referred as BLN running vertically in y-direction, while the bottom source node of each string is connected to a common source-line, referred as CSL, running horizontally in x-direction. The 32 gates of the 32 NAND transistors are connected to WL0 to WL31, running horizontally in X-direction. Each WL is commonly referred as a single page in NAND flash memory. The top and bottom gates of Select transistor are connected to SG[0] and SG[1] respectively running in horizontal x-direction. The 1-poly NMOS transistor with gate tied to SG[0] is referred as BL select transistor, while the 1-poly NMOS transistor with gate tied to SG[1] is referred as the source line Select transistor.

Both BL-select and SL-select HV NMOS transistor has to sustain 7.0V punch-through characteristics during the page program operation. Thus, the channel length of both BL-select and SL-select NMOS devices have to be made large enough, which is a large overhead of NAND string silicon area.

On the contrary, each NAND cell has not concern of the punch-through during the low-current FN tunneling scheme in Z-direction that maintains VDs=0, thus the NAND cell can be made the minimum pitch of 1λ, thus the smallest string can be achieved.

The whole NAND transistors and both BL-select and SL-select transistors in the same NAND block are formed on the same TPW within the same DNW on the common P-substrate with one common source line CSL and the multiple separate N BLs, BL1-BLN, and 32 WLs, WL)-WL31, and two separate SG lines such as SG[0] and SG[1].

FIG. 2 prior art is a schematic block diagram of prior art of a typical NAND flash memory chip comprising of M NAND memory blocks, X-decoder at left and the LV SA (Sense Amplifier) and LV PGM buffer (Program page buffer) situated on the array top.

The detailed circuit of each block is seen in FIG. 1 prior art. All M NAND memory blocks are formed on the same big TPW (Triple P-Well) within the same big DNW (deep N-well) on the common P-substrate with one common source-line CSL and the multiple M sets of separate 32 WLs, WLM[0:31] connected to the outputs of X-decoder and M pairs of dual SG lines of SGM[0:1] along with N BLs running in vertical Y-direction to connect all M blocks of NAND string. All transistors in NAND string in M blocks are formed within the same TPW within in the same DNW on the top of P-substrate.

During the erase operation, only the NAND transistors in the NAND strings in one selected block is to be erased to a negative Vt −2.0V and the Vt of the NAND cells in the remaining strings in the M−1 unselected blocks should not be disturbed or affected. Before erase operation being executed, the input N bits of incoming page data are stored in the LV SA & PGM buffer first. The details of the traditional NAND operations can be referred to many published papers and patents and would not be re-explained here again to simplify the description of this application.

Figure 3:
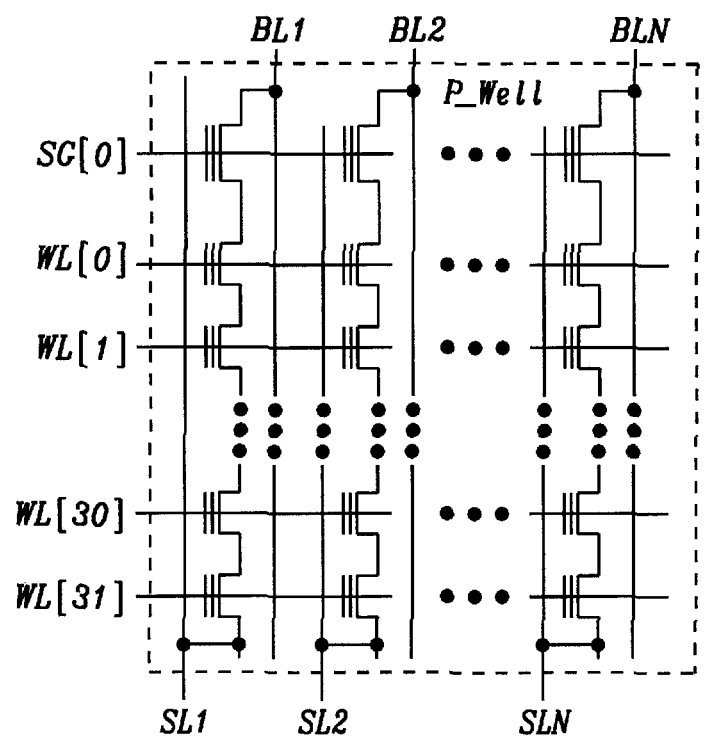
FIG. 3 is a schematic diagram of the present disclosure of a typical high-density NAND known to the inventors, hereinafter referred to as HiNAND, flash memory block comprising of N unique NAND strings. Like NAND, each NAND string comprises 32 basic 2-poly floating-gate NMOS NAND transistors connected in series with only one 2-poly NMOS SG (Select-gate) transistor located on top end of the string. The whole NAND transistors and SG transistors in the same NAND block are formed on the same TPW within the same DNW on the common P-substrate. Unlike NAND array block has just one common SL; the HiNAND array has N sets of separate N BLs and N SLs along with 32 Wls and one SG line.

FIG. 3 is a schematic diagram of present disclosure of a typical HiNAND flash memory block comprising of N unique NAND strings. As HiNAND compared to the today's NAND, it has several advantages such as shorter string length without a need of two large BL-select and SL-select HV NMOS devices. The number of SLs, SL1-SLN, is identical to the number of BLs, BL1-BLN, thus less noise is generated on the Source node of SLn during the read operation. As a result, HiNAND can have a more reliable MLC verification and reading.

Like NAND prior art, each HiNAND string comprises 32 basic 2-poly floating-gate NMOS NAND transistors connected in series with only one 2-poly NMOS SG (Select-gate) transistor located on top end of the string. The whole NAND transistors and SG transistors in the same NAND block are formed on the same TPW within the same DNW on the common P-substrate. Unlike NAND array block has just one common SL, the HiNAND array has N sets of separate N BLs and N SLs along with 32 WLs and one SG line.

The reason of using same NAND cell as the BL-select transistor is because the Program Inhibit voltage of ~7.0V is applied to both dedicated bit line metals (BLM) and source line metals (SLM). Since there is same voltage level, thus no punch-through concern ever happens to any unselected strings.

The Program and Erase schemes and the biased voltage conditions of HiNAND are kept identical to NAND. In addition to NAND cells, the top selected transistors are made the same to regular 2-poly NAND ones, thus HiNAND cell and string scalability is superior to NAND. In real layout, the string length of the HiNAND is laid out about 75% of the counterpart, NAND. HiNAND string has no unscalable Select transistor in any generation. Thus the advantage of HiNAND die size smaller than NAND chip can be achieved.

Figure 4A:
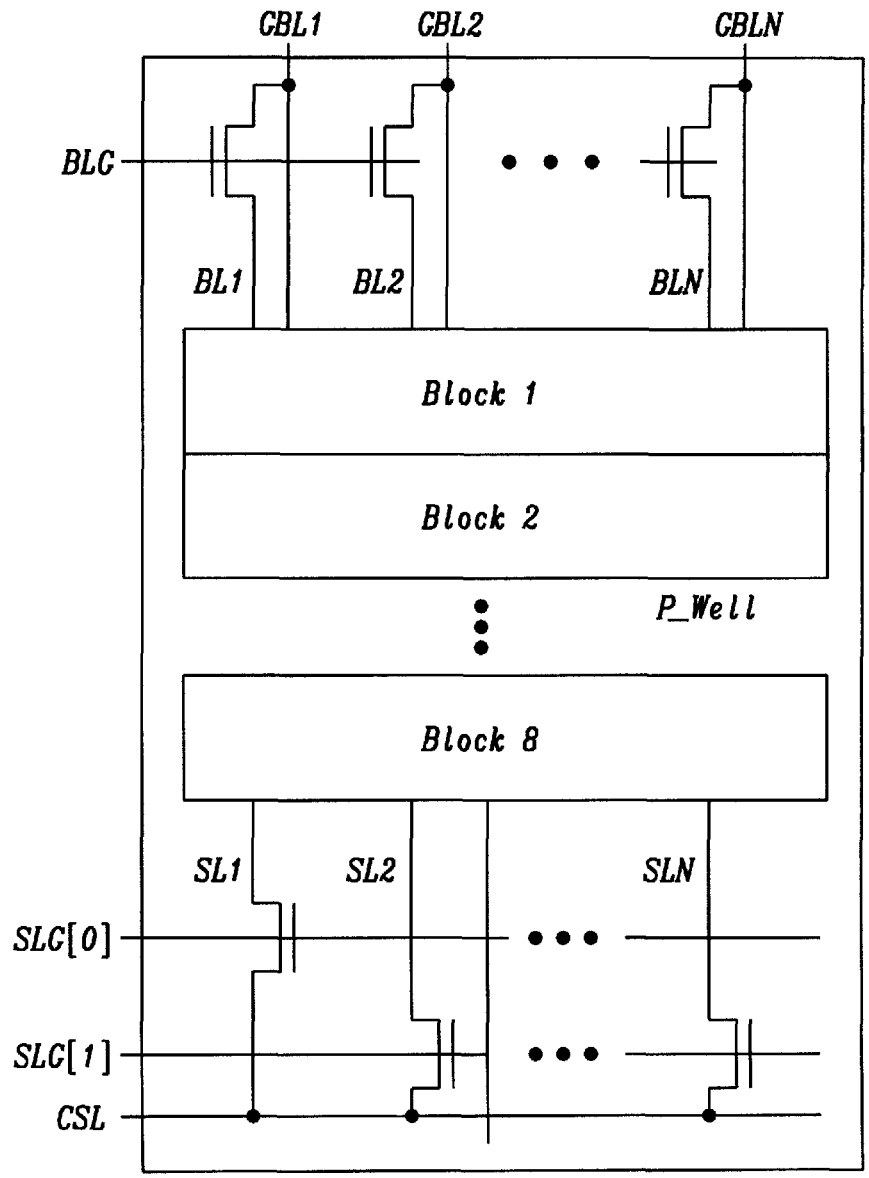
FIG. 4*a* shows a schematic diagram of present disclosure of one typical HiNAND flash memory sector comprising of eight preferable NAND memory blocks with one HV isolation device per each BL on top and one HV isolation device per each SL on bottom. The gate of BL-Isolation devices are connected by one common BLG signal but the gates of SL-Isolation devices are being divided into two groups such as the even SLs and odd SLs connected to one signal pairs of source line group SLG[0] and SG[1] respectively. The detailed circuit of each HiNAND block is seen in FIG. 3. All 8 HiNAND memory blocks and BL-isolation and SL-isolation devices are formed on the same big TPW within the same big DNW on the common P-substrate with one common source line CSL and the multiple M sets of separate 32 WLs and N common global bit lines (GBL), one bit line group (BLG) and one source-line group (SLG) signal pairs.

FIG. 4a shows a schematic diagram of present disclosure of one preferable HiNAND flash memory sector comprising of eight preferable NAND memory blocks with one HV isolation device per each BL on top and each SL on bottom. The gate of BL-Isolation devices are connected by one common BLG signal but the gates of SL-Isolation devices are being divided into two groups such as the even SLs and odd SLs connected to one signal pairs of SLG[0] and SG[1] respectively.

The detailed circuit of each HiNAND block is seen in FIG. 3. All 8 HiNAND memory blocks just has only ONE SL-isolation device but are divided into odd and even SLs and are all formed on the same big TPW within the same big DNW on the common P-substrate with one common source line CSL and the multiple M sets of separate 32 WLs and N common GBLs, one BLG and one SLG signal pairs, SLG[0] and SLG [1]. In other words, total 8 blocks would have total 256 WLs plus 8 BL-select transistors but has only one SL-isolation device. Thus as compared to traditional NAND string size, the HiNAND size is smaller due to the silicon area saving in the overhead of the large BL-select transistors in the traditional NAND string.

Totally, in this HiNAND Sector, there are N local SLs, SL1-SLN, and N local BLs, BL1-BLN, and N global BLs, GBL1-GBLN, connected to top metal layers. In addition, totally 256 WLs, WL0-WI255, are connected to 8 Blocks in the HiNAND Sector of the present disclosure.

During the program operation the program-Inhibit voltage of around 7.0V comes from the CSL of the selected Sector and gated by the selected SLG[0] and SLG[1] to the selected local BLN and local SLN to inhibit the program-inhibit cells from getting programmed to keep cells' Vt unaltered after program operation.

Figure 4B:
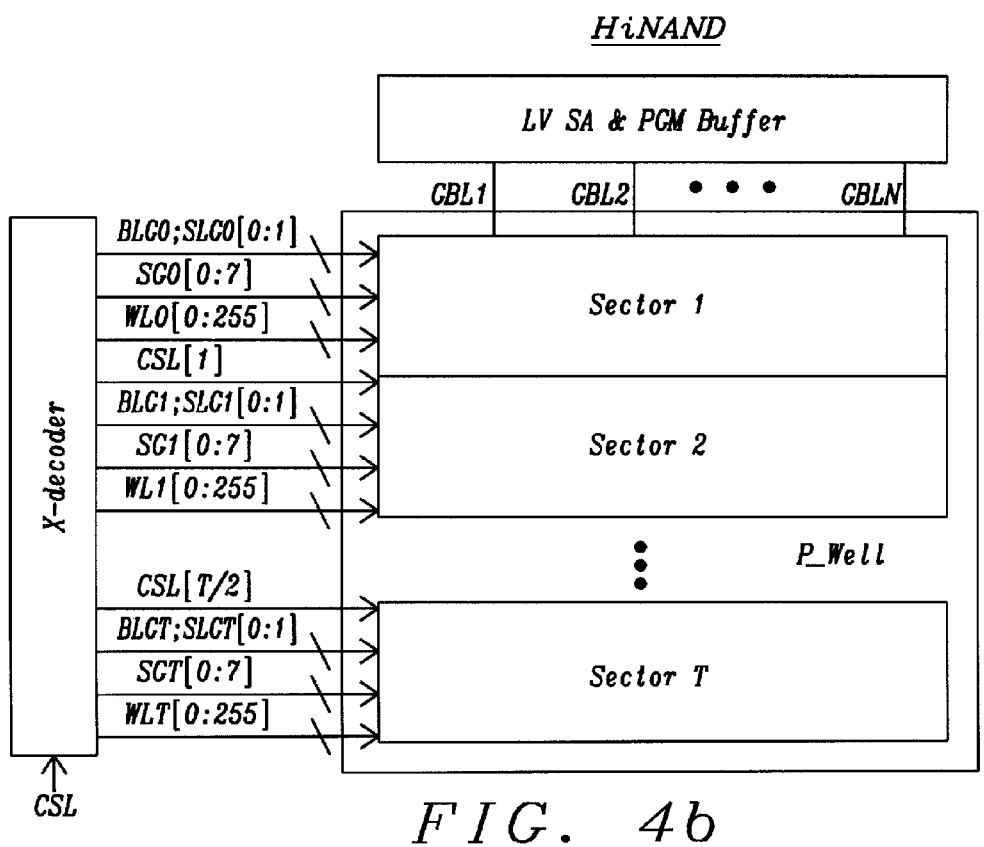
FIG. 4*b* shows a schematic diagram of present disclosure of one typical HiNAND flash chip memory comprising of T preferable NAND memory sectors with one preferable LV SA and PGM buffer on top and HV X-decoder on left. The detailed circuit of each HiNAND sector is seen in FIG. 4a and each sector has its own CSL for several operations to be explained in the subsequent pages of the application. All T HiNAND memory Sectors are similarly formed on the same big TPW within the same big DNW on the common P-substrate along with one T/2 separate CSLs and the multiple T sets of separate 32 WLs and N common GBLs, T BLG and T pairs of SLG signals.

FIG. 4b shows a schematic diagram of the present disclosure of one preferable HiNAND flash chip memory comprising of T preferable NAND memory Sectors with one preferable LV SA and PGM buffer situated on top and HV X-decoder on left.

The detailed circuit of each HiNAND Sector is shown in FIG. 4a and each sector has its own CSL line for several operations to be explained in the subsequent pages of this application. All T HiNAND memory Sectors are similarly formed on the same big TPW within the same big DNW on the common P-substrate along with one T/2 CSLs and the multiple T sets of separate 256 WLs, WL[0-255], and N common GBLs, T BLG such as BLGT-BLG0 and T pairs of SGT signals, SGT[0:1].

Two Sectors share one CSL line running in X-direction generated from X-decoder located on left block, which has one common CSL input connected to a charge pump that can generate the program Inhibit voltage to the selected local BLs and SLs of the selected Sector by turning on the corresponding SG gate. Since the 6.0V program Inhibit voltage is only coupled to one selected sector in the HINAND chip, thus the less capacitance of local BL and local SL is to be charged in program-Inhibit operation within the program time spec, thus the power-consumption is drastically reduced as compared to charge all local SL and local BLs in the whole T Sectors of the chip. Thus the pump power supply current can be greatly cut to reduce the pump silicon size.

FIG. 5 prior art shows a typical set of preferable voltage biased conditions assigned to the WLs, BLs, CSLs and SGs, TPW and DNW of the Selected block and the remaining multiple unselected blocks within a typical NAND memory Sector for the preferable FN channel Erase operation of the prior art.

In order to save the Sector silicon area, all current NAND blocks within the same Sector are formed in the same TPW and DNW to avoid any spacing required between TPW and DNW in old design. But in common NAND spec, the erase size is defined as one block only, the size of which is typically 128 Kb and is smaller than the typical NOR block size of 512 Kb. Therefore, when one small NAND block is erased, the Vts of the NAND cells in the remaining blocks within the same sector have to remain unaltered or disturbed.

In FIG. 5 prior art, the top block is selected for erase in NAND sector. Since the erase operation needs to apply a +2.0V to the common TPW and VDD to the common DNW, therefore all NAND cells within the same TPW might get all erased if the handling is not right. The current NAND approach to selectively erase only the top block is to ensure only those NAND cells have the 20V drop across the poly2-gate and TPW. The rest of NAND cells in the unselected blocks, the poly2-gate and TPW have to be maintained same voltage without drop to eliminate any FN tunneling effect.

In order to correctly achieve the desired erase on the selected block, the WLs of the selected top block are held at 0V but the WLs of unselected blocks are left floating. When the common TPW is ramped to ramped tom +20V, the unselected WLs of unselected blocks would be also coupled to same +20V. As a result, the unselected NAND cells of the unselected blocks within the same Sector would not be erased, thus the NAND cell's Vt remain unchanged.

On the contrary, since the gates of selected NAND cells are held at a fixed 0V, thus a 20V voltage drop between poly2-gate and TPW bulk occurred during the erase cycle. As a result, ThE selected NAND cells in the selected block within the selected Sector would all get FN tunneling effect and get erased to a desired value of −2.0V. Typically, NAND cells' Vt have to perform the erase-verify after erase to ensure all the NAND cells' Vt of all NAND strings in the selected block are all decreased below the desired value of −2.0V after about 2 mS erase time.

Figure 6:
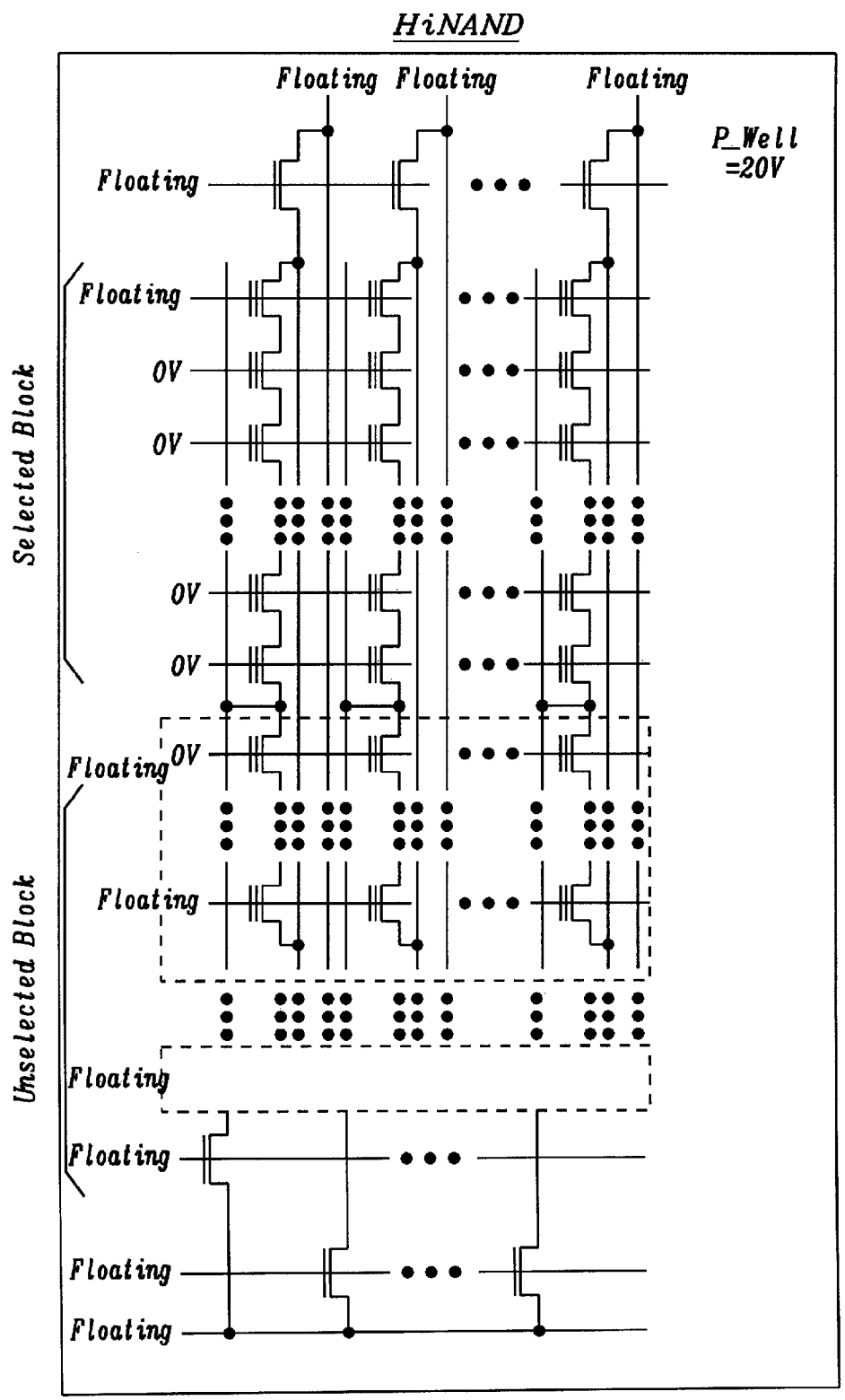
FIG. 6 shows a typical set of preferable voltage biased conditions assigned to the WLs, BLs, CSLs and SGs, TPW and DNW of the selected block and the remaining unselected blocks within a typical HiNAND memory Sector in the preferable FN channel Erase operation of the present disclosure.

FIG. 6 shows a typical set of preferable voltage biased conditions assigned to the unselected and selected WLs, BLs, CSLs and SGs, TPW and DNW of the selected block and the remaining unselected blocks within a typical HiNAND memory Sector in the preferable FN channel Erase operation of the present disclosure.

Now, the detailed operation of one Sector of HiNAND array of the present disclosure will be explained below.

In FIG. 6, the top block, the Block 0, of the HINAND is the selected one and the remaining 7 blocks below are the non-selected block for explaining how HiNAND performs the erase operation.

As like the prior art NAND, the Vt of the selected flash cells in Block 0, are decreased to be below −2.0V after the FN channel erase operation which may take about 2 mS as seen in many existing NAND specifications. In order to erase the NAND cells in the Block 0, all WLs in the Block 0 have to be coupled to 0V, while the remaining WLs are kept floating. When the common TPW is coupled and ramped to +20V against the WL voltages the NAND cells in Block 0 would get erased due to the electrical field across the poly2 to TPW is maintained 20V. As a result, after erase operation around 2 mS, all NAND cells' Vt should be below −2.0V when erase verification is followed after erase. But Vt of those NAND cells in the remaining 7 Blocks would remain unaltered due to coupling effect, the poly2-gate on WL would have the same voltage as TPW of 20V. Thus there is no electrical field to induce any FN tunneling effect. In order to protect the other transistors formed in the same selected Sector, their gates should be left floating as specified in FIG. 6 of the present disclosure.

To erase any block in the remaining 7 blocks, the same procedures applied to Block 0 can be repeatedly applied to the selected one and to achieve the same erased vt after the erase operation. The erase procedure can go on one block by one block until all blocks in the selected Sector is fully erased and passed with the erased verification. In common NAND spec, a random Block is selected to be erased.

Since the top select transistor is also preferably made of identical 2-poly NAND cell with same channel length and width, their Vt has to be kept unaltered in the regular block erase operation. Thus, its gate voltage is kept floating as the unselected WLs in the unselected Blocks in the selected Sector, Thus, during the erase operation, the poly2-gate of the selected Select transistors are coupled to the same TPW's 20V when TPW is ramped to +20V on the selected block. Thus no electrical field is established across Select transistors; gate and TPW. As a result, the initial Vt of the Select transistor would remain unaltered as desired.

But in the very beginning of array erase operation, the gates of Select transistors of the selected blocks have to be coupled to 0V to get erased in the $1^{st}$ erase cycle to the selected Block. After $1^{st}$ erase cycle, the Vt of selected SG transistor would be erased to −2.0V. After that a page program operation particularly reserved for SG transistor page is performed subsequently after erase. The Vt of Select-gate transistor can be programmed to a positive Vt value, ranging from 0.7V to 1.0V for a low-voltage 1.8V VDD operation. The Vt set for the Select transistors in the same page is only necessary in the $1^{st}$ cycle. After that, the gate voltage of Select transistors should remain floating to ensure that no disturbance is caused by the subsequent block erase operation and program operation.

FIG. 7 prior art shows a typical set of voltage biased conditions assigned to the WLs, BLs, CSLs and SGs, TPW and DNW of the Selected block and the remaining unselected blocks within a typical HiNAND memory Sector in the FN channel full Page-program operation of the prior art NAND array.

As can be seen from the example, the selected page in the selected block is marked with gate of the WL coupled to +20V, while the remaining WLs in the selected block are coupled to 10V along with the top gate of Select transistor coupled to VDD but the gate of the bottom select transistor coupled to 0V. The TPW voltage is biased at 0V with DNW biased at VDD on 0V P-substrate. All the NAND cells in the remaining strings in the unselected blocks are held floating except the gates of top and bottom Select transistors are tied to 0V.

The program operation uses the coupling effect from Poly2-gate to the NAND cell's channel in the selected page. The selected cell's BL is coupled to 0V, while the unselected programmed cells' BLs are coupled to VDD to make shut off the leakage from selected NAND cell's channel to BL and SL. As a result, the effective program Inhibit voltage can be produced through the Poly2-coupling effect. The detail is not to be further explained here and can refer to the published papers and patents. Using the dynamic coupling effect to produce the program Inhibit voltage in the selected un-programmed cells' channels is very popular in NAND design.

Although the un-programmed cell's program Inhibit voltage is around 7V in the cells' channel, the BL voltage required to produce this Inhibit voltage just requires VDD, which is a low voltage. As a result, today's NAND design using the coupling-generated Program Inhibit voltage requires only VDD or VSS in all BLs. Thus, the SA and PGM buffer does not need to generate any Inhibit HV. Therefore, a small LV SA and PGM buffer is built in all NAND design today for area reduction.

In the above biased conditions, the NAND cells in the selected page of the selected block would get programmed and later being performed program verification. Once pass the program verification, the Vt of selected NAND cells would be programmed to positive the desired Vt levels. In single level cells (SLC), the programmed Vt is referred as Vt1 of value around +2.0V. In MLC, then the 3 positive Vts would be Vt1 of 1.0V, Vt2 of 2.5V and Vt3 of 4.0V. The erased Vt is Vt0 of a value below −2.0V initially.

Figure 8A:
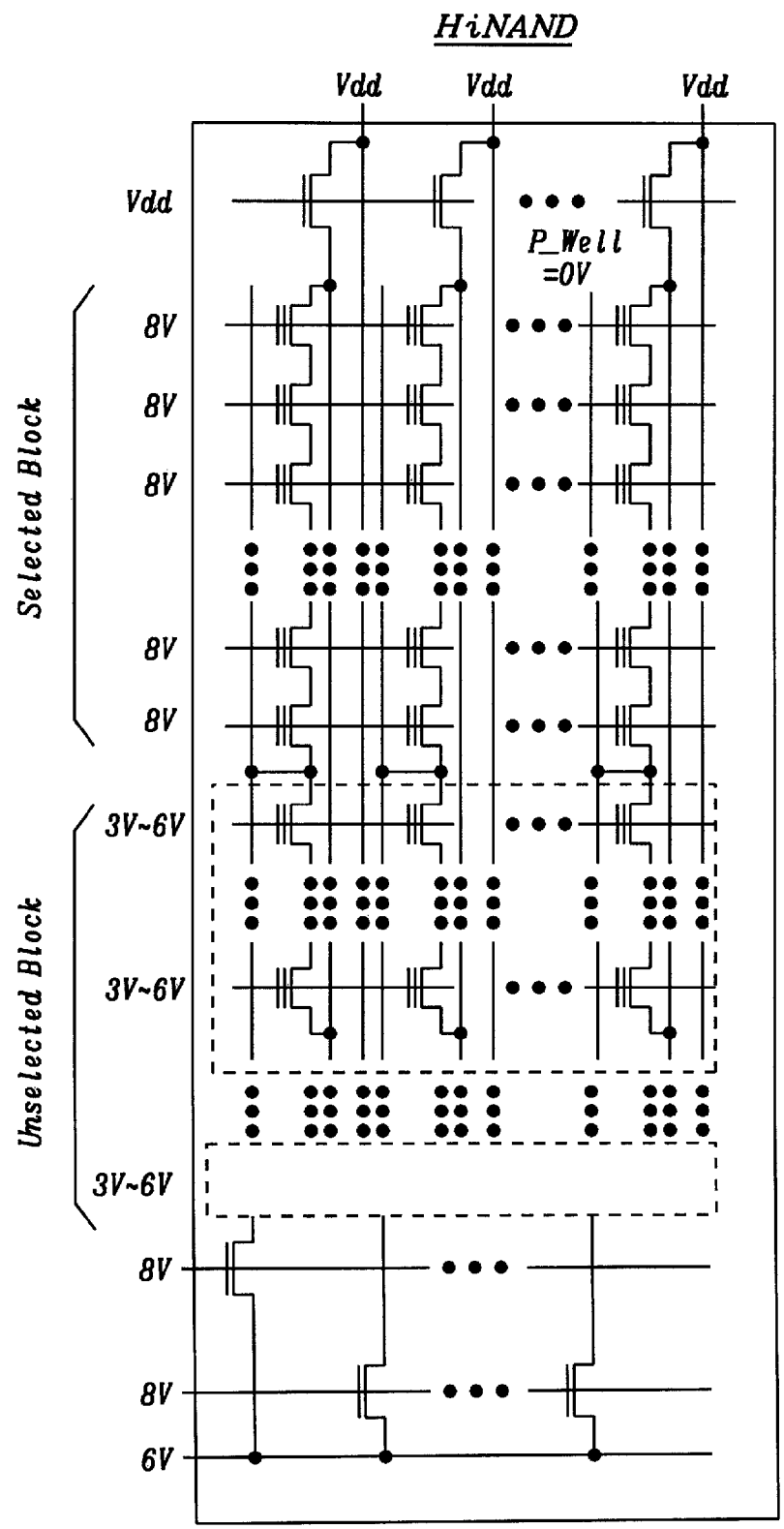
FIG. 8a shows a typical set of preferable voltage biased conditions assigned to the WLs, BLs, CSLs and SGs, TPW and DNW of the Selected block and the remaining unselected blocks within a typical HiNAND memory Sector during the $1^{st}$ cycle of the pre-charge period of the preferable half-page Program operation of the present disclosure.
Figure 8B:
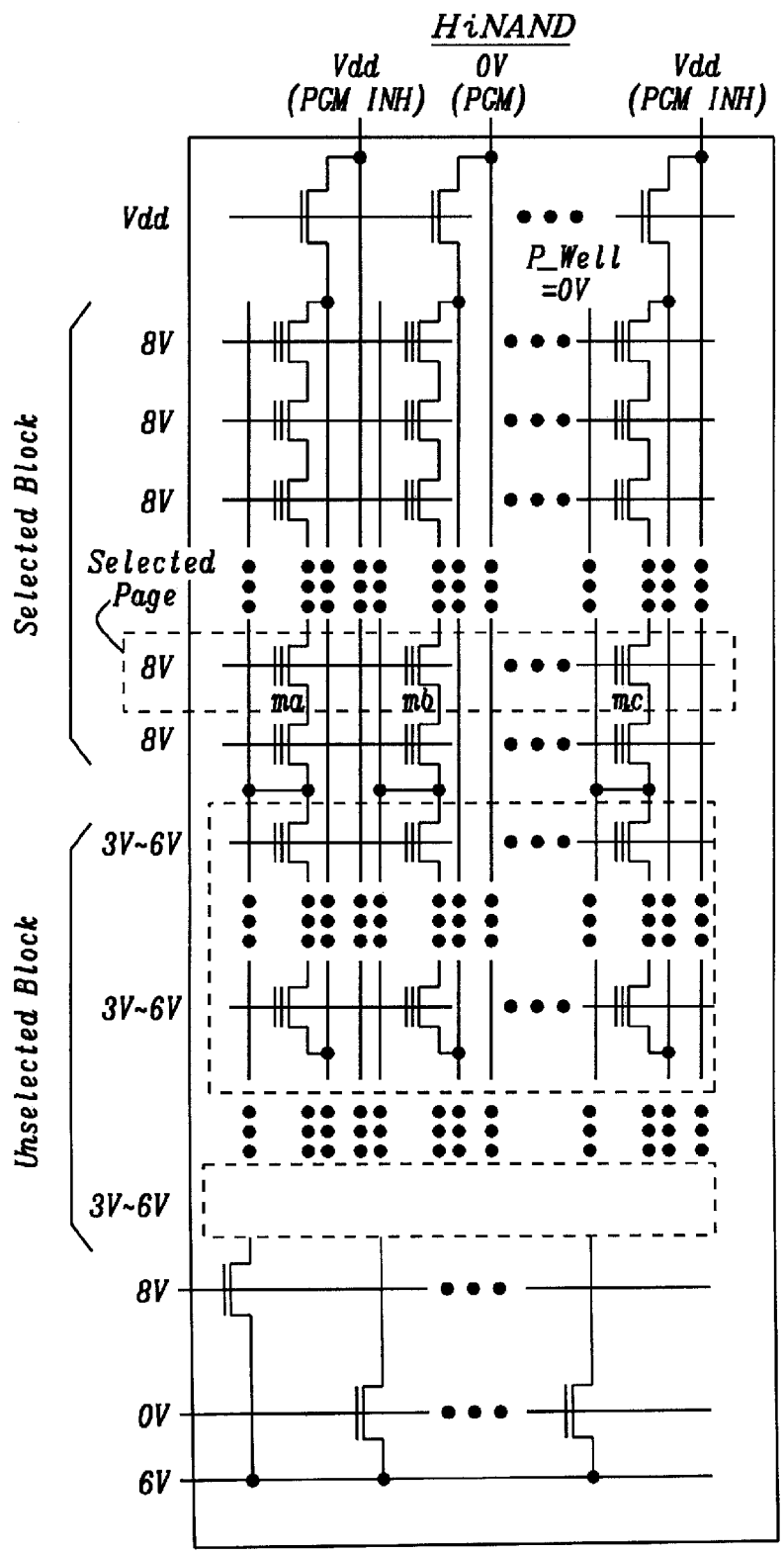
FIG. 8b shows a typical set of preferable voltage biased conditions assigned to the WLs, BLs, CSLs and SGs, TPW and DNW of the Selected block and the remaining unselected blocks within a typical HiNAND memory Sector during the $2^{nd}$ cycle of the Data settling period of the preferable half-page Program operation of the present disclosure.
Figure 8C:
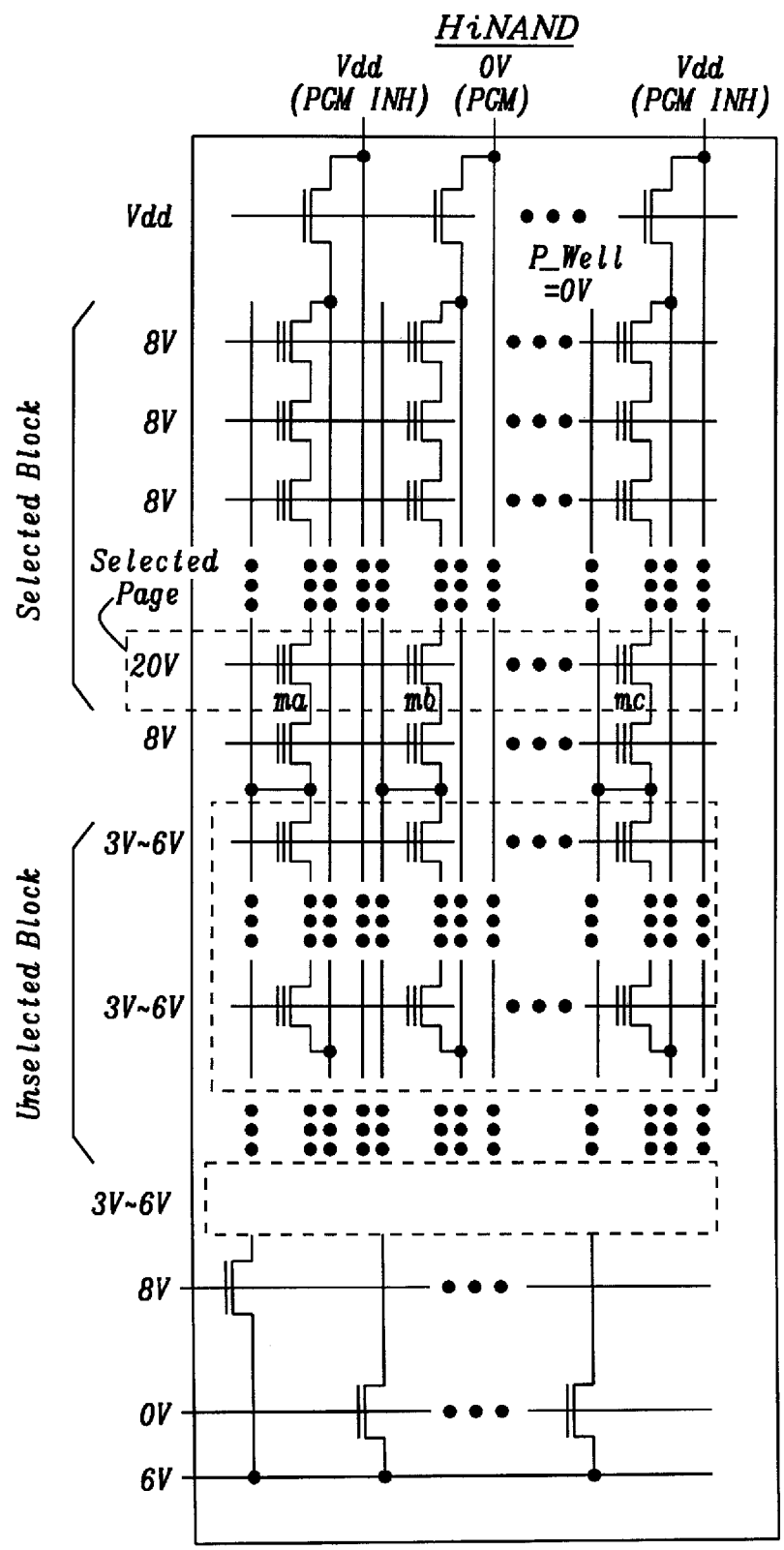
FIG. 8c shows a typical set of preferable voltage biased conditions assigned to the WLs, BLs, CSLs and SGs, TPW and DNW of the Selected block and the remaining unselected blocks within a typical HiNAND memory Sector during the $3^{rd}$ cycle of the Program period of the preferable half-page Program operation of the present disclosure.

From FIG. 8*a* to FIG. 8*c* show the preferable novel page program operation is performed in unit of half-page and the whole program cycle is being divided into 3 sub-cycles of the present disclosure for the preferable HiNAND array.

The key difference between HiNAND and NAND in page-program operation is not the program gate voltage of +20V applied to the selected page. The major difference is how to generate the program inhibit voltage in the unselected BLs in the selected page of the selected block.

The traditional NAND flash memory uses the dynamic coupling to generate the dynamic program Inhibit voltage. This is a pretty good technique and is being extensively used in NAND products. But in NAND, the penalty of the simple dynamic coupling program method is at the expense of two large Select transistors overhead in a NAND string length. The select gate transistor's channel is made very large and is not scalable as NAND cell's channel because it has to sustain the 7V punch-through voltage across the channel region between the drain and source nodes during the page program operation.

On the contrary, the Program-Inhibit voltage of ~6.0V of the HiNAND is a Static pre-charge approach. This Program-Inhibit voltage is generated from the on-chip charge-pump circuit and is supplied to the common node of CSL. Then through the decoders and proper circuit designs, this program-inhibit voltage (PIV) will be forwarded to the right unselected BL in the selected page to avoid undesired program operation. The details would be further described below.

FIG. 8*a* shows a preferable set of voltage biased conditions assigned to the selected and unselected WLs, BLs, CSLs and SGs, TPW and DNW of the Selected block and the remaining unselected blocks within a typical HiNAND memory Sector during the $1^{st}$ program cycle, which is cited as Pre-charge period (PC). The PC cycle has to be performed in unit of the half-page of the present HiNAND disclosure. And that is why the SL Isolation devices are divided into two groups. The $1^{st}$ group is the odd SLs and $2^{nd}$ group is the even SLs. The gates of these two groups are separated but the source node of these SL-isolation devices are connected to a common SLs which is cited as CSL.

In FIG. 8*a* shows there are only two rows of SL-isolation devices with their gates connected to odd and even control signals per one Sector. Each Sector has 8 preferable blocks. During the PC period, all odd and even local BLS and local SLS are preferably pre-charged to PIV. As a consequence, the CSL and SLG[0] and SLG[1] are coupled to 6V, 8V and 8V respectively with all BL-selected transistors are biased in off-state by coupling all GBLs to VDD and gate of BLG voltage to VDD as well.

During the preferable PC cycle, the 6V of PIV comes from CSL through odd and even SL-isolation devices to all local BLs and SLs of the selected Sector and would not leaked away to GBLs because all BL selected transistors remain in the shut-off state. This PC time is subject to the capacitance of each local BL and local SL. In this HiNAND array, it is preferable to have total 256 WLs in 8 blocks within the same Sector. Thus each local short BL and local short SL capacitances are less than 0.2 pf. As a result, the PC time for the selected ONE sector is aimed to be less than 5 uS-10 uS.

In order to reduce the program disturbance to the remaining seven unselected blocks in the selected Sector, the WLs' voltages of the unselected blocks are biased to a voltage, ranging from 3V to 6V. The reason to apply 3V-6V to the unselected WLs is because the Inhibit BLs' voltage is 6.0V. If the 3.0V is used in which is ½ of PIV, then the program-Inhibit BL and SL disturbance (BLD and SLD) to the unselected NAND strings are equally divided. The BLD is reduced 3V because the voltage drop between unselected NAND cells' drain and gate is 3.0V. Similarly, the WL disturbance is 3V on the selected cells with channel biased at 0V in the selected page. But if the WL voltage of the unselected NAND cells is biased at 6V, the BLD to the unselected NAND cells in the unselected BLs is reduced to zero. On the contrary, the WL-disturb to the selected NAND cells in the selected BL and page become large of 6.0V from Poly2-gate to cells' channel. But since NAND channel FN program needs to have about 20V between channel and poly2-gate, thus 6.0V of WL-disturb during the short page program time can be accepted.

At the end of $1^{st}$ PC cycle period, the on-chip charge-pump is preferably remaining active so that the PIV can be well maintained in all local bit lines (LBL) and local source lines (LSL) of the Selected Sector and blocks. After $1^{st}$ PC cycle, now the program operation will be immediately moved to the $2^{nd}$ cycle which is cited as Data Setting Period, DSP.

FIG. 8b shows an embodiment of the preferable voltage biased conditions assigned to the WLs, BLs, CSLs and SGs, TPW and DNW of the Selected block and the remaining unselected blocks within a typical HiNAND memory Sector during the $2^{nd}$ cycle of the Data settling period. This cycle has to be performed in unit of a half-page Program operation of the present disclosure.

As explained in FIG. 8a, all local BLs and SLs are precharged to PIV during the $1^{st}$ PC cycle. That means in the beginning of the $2^{nd}$ cycle, all local. BLs (LBLs) and local SLs (LSLs) are still maintained at PIV which is set to be around 6V when pump is held active. Now the half-page program operation of the HiNAND is followed. In this $2^{nd}$ cycle, the GBL voltage in each GBL is coupled to either VDD and VSS as set in the $1^{st}$ cycle. The GBL voltage set to be 0V is selected for programming the cells in the selected page, while the GBL voltage set to be VDD is selected for unprogram as explained above.

Since all LBLs are held at PIV in the beginning of this $2^{nd}$ cycle, thus the selected LBL for program have to be discharged to 0V through the selected BL-isolation device when the selected GBL is set to be 0V by the data pattern stored in the LV SA and PGM buffer from external pins of the present disclosure. But in order to discontinue the leakage to the 0V GBL, the corresponding LSL connected to the pump of 6.0V has to be disconnected. As a consequence, the gates of all NAND transistors connected to SG[1] are coupled to 0V so that all the selected LBL would be pulled to 0V and non-selected BL would be kept 6.0V in half-page without placing any current loading on the pump.

One the contrary, another half-page is still held at 6.0V because the gates of all SG[0] are still coupled to 8V and source conductive layer (SCL) is still held at 6V.

Since each selected LBL is sandwiched by two adjacent unselected LBLs which are held at 6V, so that the selected BLs voltage would not pulled to low due to coupling effect of the discharge. As a result, the one half-page program can be performed without errors, according to the data pattern stored in the LV SA and PGM buffer. Now at the completion of the $2^{nd}$ cycle, all half-page cells in the selected page would have the right program LBL voltage of 0V and right program-Inhibit LBL voltage of 6V ready for the $3^{rd}$ cycle of program operation.

FIG. 8c shows a preferable set of voltage biased conditions assigned to the WLs, BLs, CSLs and SGs, TPW and DNW of the Selected block and the remaining unselected blocks within a typical HiNAND memory Sector during the $3^{rd}$ cycle of the Program period of the preferable half-page Program operation of the present disclosure. In this $3^{rd}$ half-page program cycle, +20.0V of program WL voltage is achieved by ramping the selected WL voltage from the initial about 8-10V to the final 20V for the accurate half-page program of the present disclosure. For good control over the NAND cells' Vt in the selected half-page, the selected gate voltage can be gradually increased one pulse by one pulse. The program operation practically is an iterative process. The program time spec is being divided into around 10 pulses with each pulse set to be around 20-25 uS. Whenever the half-page program is performed, a half-page program verification will be performed subsequently. The process will be repeated until the all bits are in half-page being successfully programmed. Then the next half-page program steps will be repeated from FIG. 8a through FIG. 8c until the whole page data being correctly programmed without errors.

FIG. 9 prior art shows a typical set of preferable voltage biased conditions assigned to the WLs, BLs, CSLs and SGs, TPW and DNW of the Selected block and the remaining unselected blocks within a typical NAND memory Sector during the Read operation of the prior art.

The selected block in FIG. 9 prior art is the top block in the selected Sector and the selected page is in the middle of the selected NAND string. The NAND string can be made of 32 or 64 NAND cells connected in series. The biased conditions for all GBL are set to be 0.5V initially in the Read cycle. The Read operation is performed in unit of whole page.

For accurate read, the selected WL is coupled to a read voltage (Vr) and the rest of the WLs in the selected block are coupled to the same pass-voltage of 6.0V which must be higher than the highest NAND's Vt value. If the NAND stores SLC Vt, then the one Vr1 is required. But if the NAND stores 4 MLC Vt states, then 3 Vr such as Vr1, Vr2 and Vr3 values are required to read out 4 stored MLC values. The selected gate WL voltage is incrementally increased three times of Vr1, Vr2 and Vr3 to read out 3 distinguished Vt values stored in all NAND cells in the selected page. Typically, Vr0 is 0V, Vr1 is 1.5V and Vr2 is 2.5V and Vr3 is 3.5V along with 4V values are set to be Vt0 of −2V, Vt1 of 1V, Vt2 of 2V while the Vt3 is set to be around 3V.

During read operation, when the Vr value is higher than the stored Vt value, then the selected GBL voltage would be discharged to 0V, otherwise GBL voltage would remain the same initial pre-charged value of 0.5V. The typical page read speed in today's MLC NAND is around 60 uS. For SLC NAND, the page read speed is around 20 uS.

The details of NAND read operation can be referred to many published papers and patents and would not be further explained here for description simplicity of the present disclosure.

Figure 10:
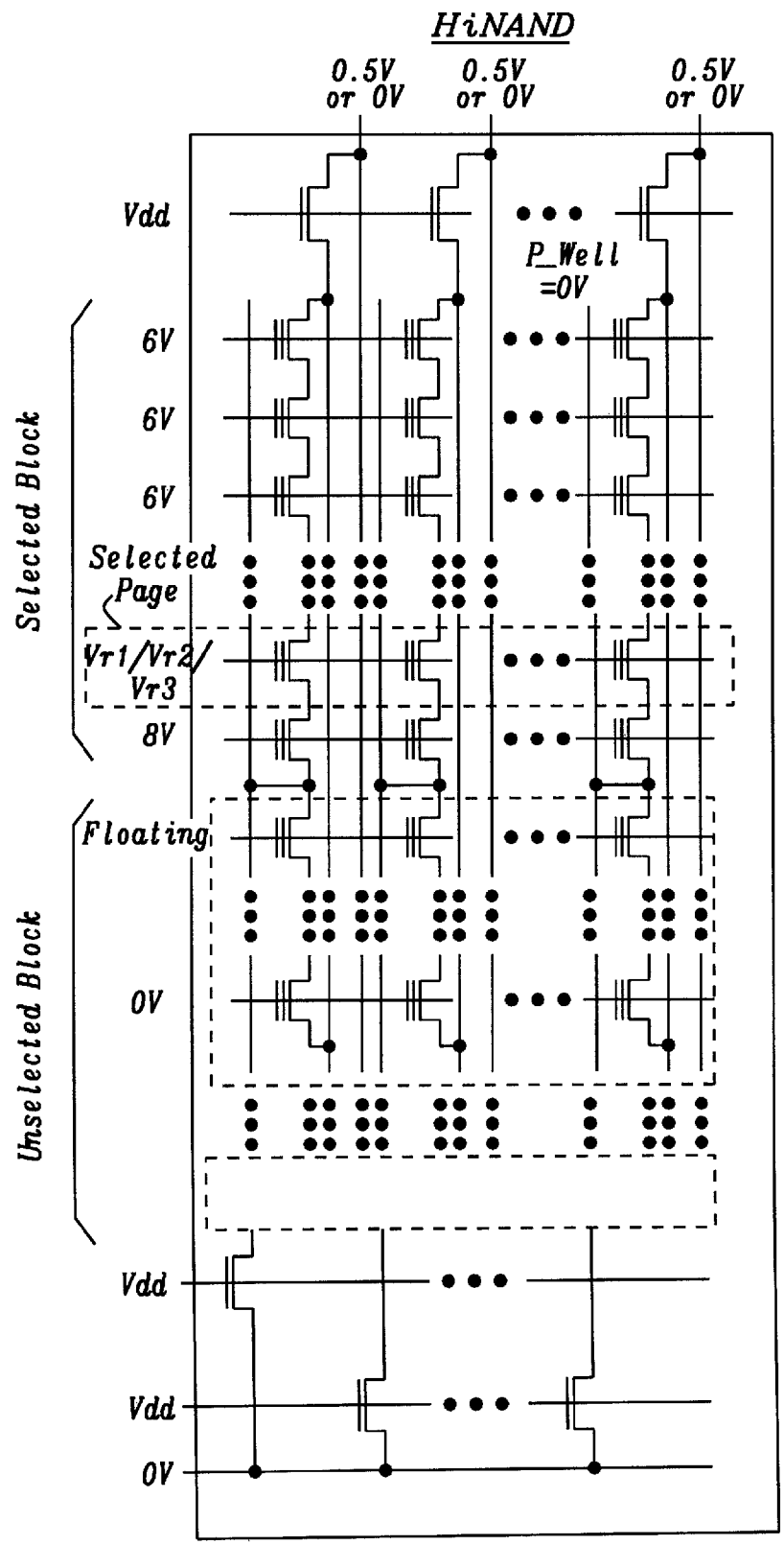
FIG. 10 shows a typical set of preferable voltage biased conditions assigned to the WLs, BLs, CSLs and SGs, TPW and DNW of the selected block and the remaining unselected blocks within a typical HiNAND memory Sector during the Read operation of the present disclosure.

FIG. 10 shows a similar set of preferable voltage biased conditions assigned to the WLs, BLs, CSLs and SGs, TPW and DNW of the selected block and the remaining unselected blocks within a typical HiNAND memory Sector during the Read operation of the present disclosure.

Like NAND, the goal of HINAND is to store both SLC and MLC and even XLC for extremely high-density, wherein XLC is a NAND cell which can store 8 distinguished threshold voltages Vts.

Therefore, the selected WL voltage in read operation has to be coupled to Vr value as NAND one explained FIG. 9 prior art. The values of Vrn and Vtn of HINAND can be set to be the same as the NAND ones due to the same NAND string architecture. Therefore, the pass-gate voltage of ~6.0V is coupled to the non-selected WLs in the selected string and both SL-isolation devices have to be held in conduction state with gate voltage coupled to VDD along with SCL held at 0V and top GBL and LBL selected transistors' gates are also coupled to VDD to be on conduction state for read sensing. The unselected blocks WL voltages are "don't care" as long as their LBL selected gate are in non-conduction state and remains off from the GBL.

Figure 11:
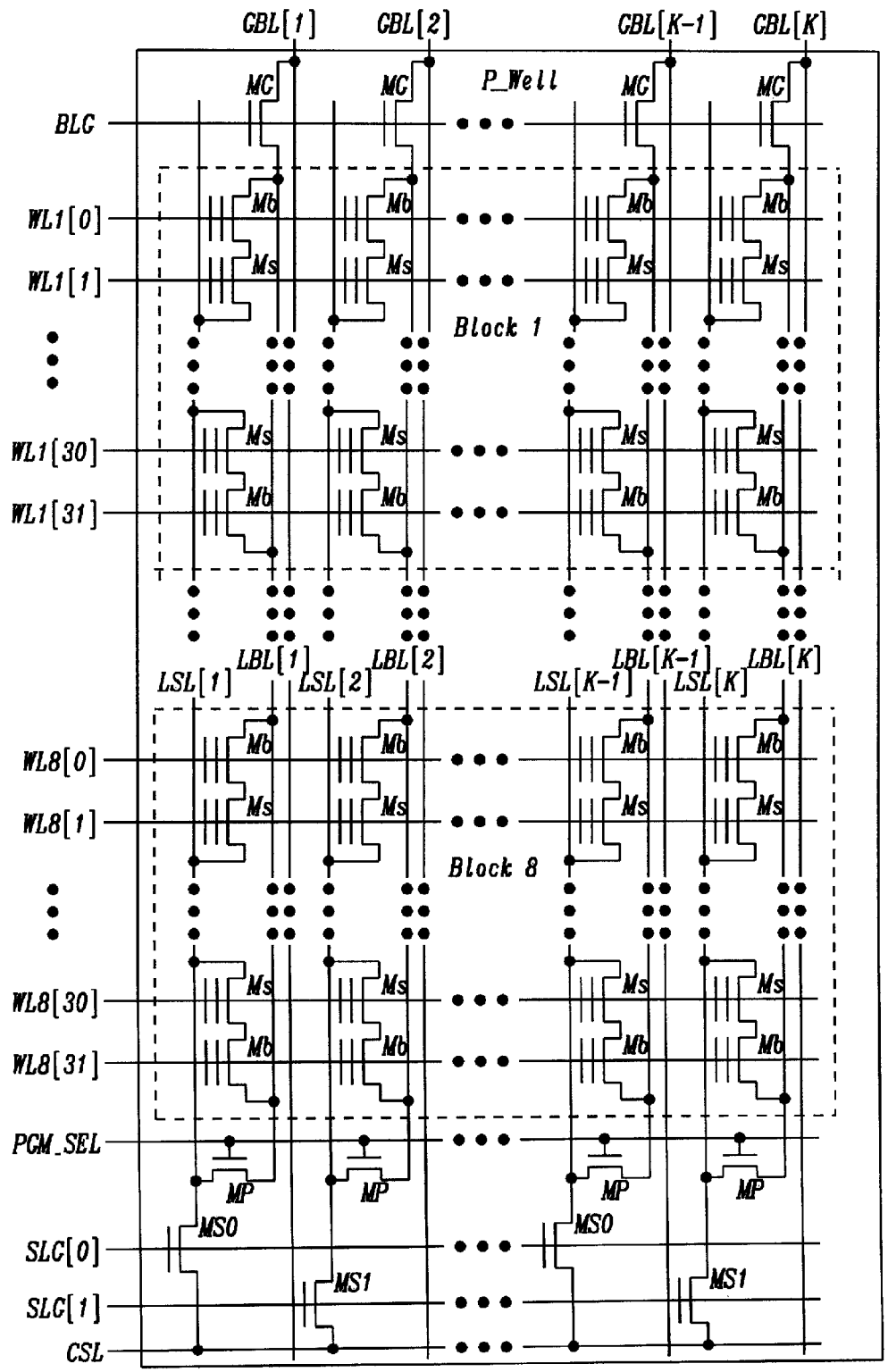
FIG. 11 shows a schematic diagram of present disclosure of one typical HiNOR flash memory Sector that comprises eight (8) preferable HiNOR memory blocks. Each block comprises 32 WLs, K pairs of GLBs and GSLs and one HV BL-Isolation NMOS device and one pairs of HV SL-Isolation NMOS devices connected to a common source line named as CSL. The HiNOR unit cell comprises two 2-poly, floating-gate, symmetrical NMOS storage transistors connected in series.

FIG. 11 shows a schematic diagram of present disclosure of one typical HiNOR flash memory Sector that comprises eight (8) preferable HiNOR memory blocks. Each block comprises a plurality of HiNOR basic cells of 2 T symmetrical 2-poly floating-gate NAND cells of Mb and Ms (Mb and Ms are NVM cells connected to local BL and Local SL respectively) formed in matrix with their paired gates connected to 32 WLs, WLn[0]-WLn[31], one row of top Divided BL 1-poly HV NMOS devices, MG, gated by a horizontal line of BLG, two rows of SL-Isolation HV NMOS devices, MS0 and MS1, gated by a pair of signals of SLG[0] and SLG[1] running in parallel to WLs in x-direction and one row of equalization HV NMOS devices, MP, gated by PGM_SEL signal. Each column of HiNOR cell array is being configured with one pair of LBL and LSL running vertically in parallel with respective metals in Y-direction.

The signal of SLG[0] is used to connect the odd LBL and the signal of SLG[1] is used to connect that even LBL to the same common source line of CSL in x-direction which is connected with another horizontal metal. The Divided BL device MG is used to connect the LBL to GBL. The two 1-poly HV NMOS SL-isolation devices of MS0 and MS1 and one Divided BL 1-poly HV NMOS device of MG, all have to be made in the same TPW within the same DNW with all NAND cells of the HiNOR array and have to be able to sustain the BL punch-through 7.0V Program-Inhibit voltage during program operation. The HV NMOS devices of MS0 and MS1 can be made of the same device as MG.

Figure 12:
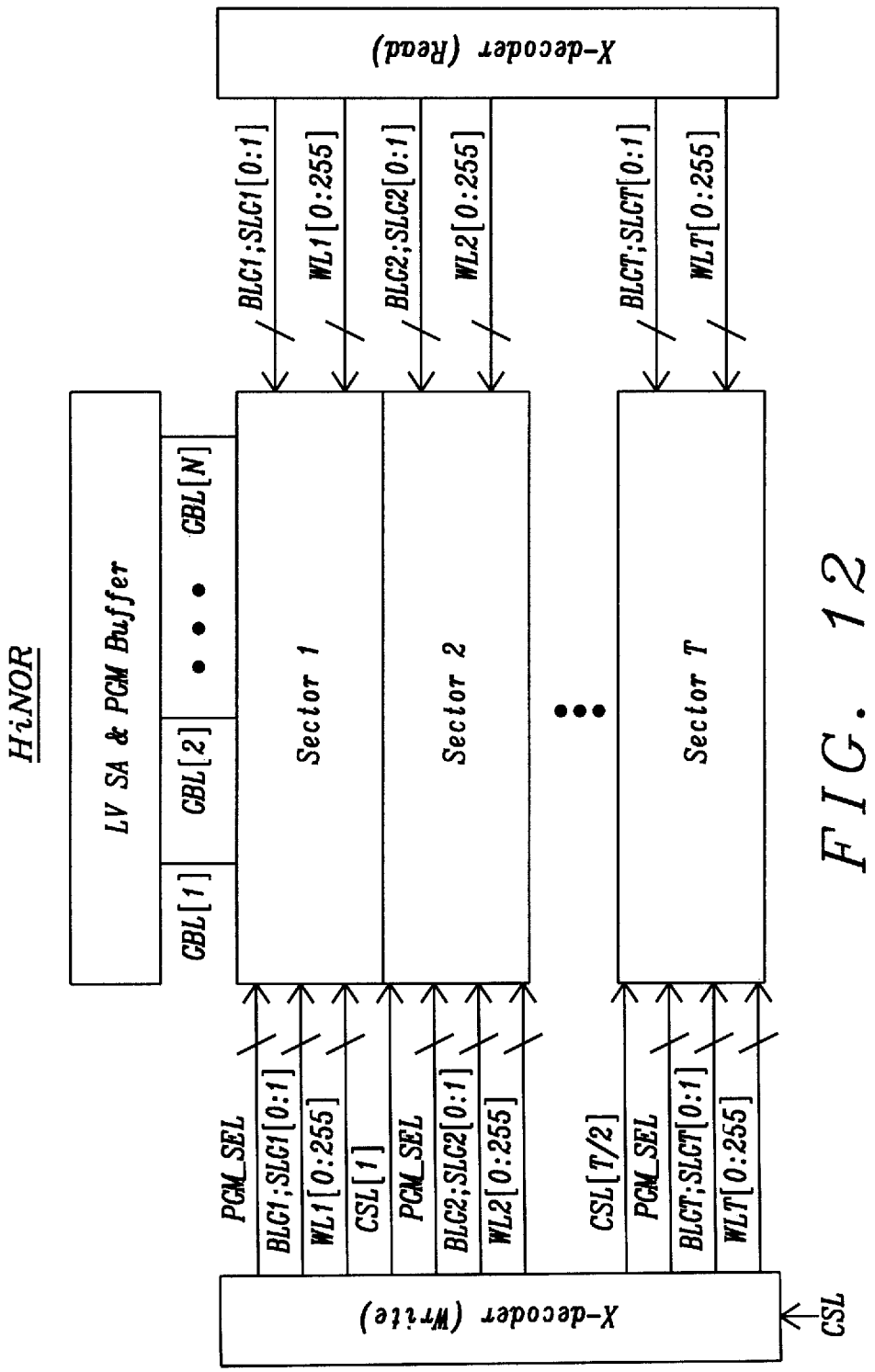
FIG. 12 is a schematic block diagram of a typical HiNOR flash memory array comprising T HiNOR memory Sectors, a 1st X-decoder responsible for HV Write operation placed at left and a 2nd X-decoder responsible for LV Read operation placed at right plus a LV SA (Sense Amplifier) and LV PGM buffer (Program page buffer) situated on the HiNOR array top.

FIG. 12 is a schematic block diagram of a typical HiNOR chip memory comprising a plurality of T HiNOR memory Sectors, Sector1-SectorT, a X-decoder responsible for all HV Write operation placed at left and the X-decoder responsible for all LV Read operation placed at right plus one LV SA (Sense Amplifier) and LV PGM buffer (Program page buffer) situated on the array top.

The detailed circuit of each Sector in FIG. 12 is seen in FIG. 11. All T HiNOR memory Sectors are formed on the same big TPW within the same big DNW on the common P-sub with one common source line CSL and the multiple M sets of separate 256 WLs connected to the outputs of X-decoder and M sets of dual SG lines along with N GBLs and T/2 CSL lines.

There are five features of the HiNOR array of the present disclosure:

The $1^{st}$ feature is to use the same LV SA & PGM Buffer like today's NAND, thus the size can be easily fitted into the tight x-pitch of HiNOR cells in x-direction. As a result, the operation of LV SA & PGM buffer would allow the simpler State-machine and circuit in handling all the key operations.

The $2^{nd}$ feature is to separate the HV write and LV read operation and circuit in two separate and independent blocks. Thus the fast Write and fast read can be respectively optimized with the best performance. All write operations involve the HV generations, charging and discharging of all selected and non-selected WLs, BLG and SLG lines and SCL lines. All these HV related operations would be fully handled by the circuit of the left Write X-decoder. The HV related operations include the Full page-erase and erase-verify, Half-page program and verification, how to generate the Erase and Program voltages, Erase-Inhibit and Program-Inhibit voltages in GBL, LBL, LSL and WLs and BLG, SLG and CSL lines and how to discharge HV after erase and program operations, etc.

The $3^{rd}$ feature is to provide an array program operation method to ensure the HiNOR cell array can follow the today's highly scaling pace of NAND down to 10 nm or even 7 nm. The principle of HiNOR program operation follows the NAND scaling path because it keeps the local BL and local SL same voltage during the program operation. With same local BL and local SL same voltage, then the drain-source voltage Vds of Ms and Mb flash cells would be zero. Therefore there is no punch-through concern as the conventional NAND cell in program operation. Thus, the scaling of HiNOR cell and array should follow the conventional NAND path.

The $4^{th}$ feature of this disclosure is to provide the HV 6-7V program-Inhibit voltage to the selected LBL and LSL with minimum required capacitance to allow the low-current but fast program Inhibit charge to reduce the current consumption of the on-chip charge pump area. The goal is to use the available on-chip 20V charge-pump circuit for erase, program as well as for the lower 6-7V Program-Inhibit voltage for the present HiNOR operation. Thus no extra pump is needed to save silicon area.

The $5^{th}$ feature is to eliminate the complex and less-reliable coupling-type program operation as used in NAND flash memory. Although this HiNOR array is based on NAND-cell and process, its array is configured into a complete NOR array for the fast and random read operation. Unlike NAND, the program and program-inhibit operation of this HiNOR memory is a complete static program and Program-inhibit design. Thus the whole operation can use a very simple state-machine design for faster and less risk flash memory.

The similar approach of HiNOR will be also applied to HiEE as well and will be fully appreciated and become clear by those skilled in the flash art by reading the subsequent detailed explanations of this application.

FIG. 13 shows a typical set of preferable voltage biased conditions assigned to the WLs, BLs, CSLs and SGs, TPW and DNW of the Selected block and the remaining unselected blocks within a typical HiNOR memory Sector during FN channel erase operation of the present disclosure.

As like the prior art NAND, the Vt of the selected flash HiNOR cells in Block 0, are decreased to be below −2.0V after the FN low-current channel erase operation which may take about 2 mS spec. To erase the HiNOR cells in the Block 0, all WLs in the Block 0 have to be coupled to 0V, while the remaining WLs are kept floating. When the common TPW is coupled and ramped to +20V against the 0V WL voltages, the HiNOR cells in Block 0 would get erased due to the electrical field across the poly2 to TPW maintained at 20V. As a result, after erase operation around 2 mS, all HiNOR cells' Vt in Block 0 should be below −2.0V when erase verification is followed after erase. But Vt of those HiNOR cells in the remaining 7 unselected Blocks would remain unaltered due to the coupling effect that would result in the poly2-gate voltage on WL to be the same voltage as TPW of 20V. Thus there is no electrical field to induce any FN tunneling effect, i.e., due to the coupling effect, the NAND flash cell's channel and gate have to same 20V voltage. As a result, there is no voltage drop across the tunneling oxide. Thus erase is inhibited.

In order to protect over the other transistors formed in the same selected Sector, their gates should be left floating as specified in FIG. 13 of the present disclosure.

To erase any block in the remaining 7 blocks of HiNOR array, the same procedures applied to Block 0 can be repeatedly applied to the selected one and to achieve the same erased Vt after the erase operation. The erase procedure can go on one block by one block until all blocks in the selected Sector is fully erased and passed with the erased verification. In common NOR spec, a random Block is selected to be erased.

Since the top BL select transistors, M0, are made within the same TPW with the HINOR cells, thus their Vt have to be kept unaltered in the regular block erase operation. Thus, their gate voltage WLs and GBLS kept floating as the unselected WLs in the unselected Blocks in the selected Sector. Thus, during the erase operation, the poly2-gates of the selected Select transistors are coupled to the same TPW's 20V when TPW is ramped to +20V on the selected block. Thus no electrical field is established across Select transistors', MG, gate and TPW. As a result, the initial Vt of the Select transistor would remain unaltered as desired.

FIG. 14a, FIG. 14b and FIG. 14 c show three key low-current FN sub-program cycles of the HiNOR array of the presentation like HiNAND's program operation described previously in this application to reduce the on-chip charge-pump silicon area and power consumption.

In FIG. 14a, it shows the preferable set of biased voltage conditions on the WLs, LBL, LSL, GBL, BLG, SLG pairs and CSL, TPW and DNW of the selected and unselected Blocks of selected and unselected HiNOR Sectors.

During the $1^{st}$ program cycle, which is similarly cited as Pre-charge period (PC), the PC cycle has to be performed in unit of the half-page of the present HiNOR disclosure. And that is why the SL Isolation devices are divided into two groups. The $1^{st}$ group comprises a plurality of the odd LSLs gated by MS0 and $2^{nd}$ group comprises of another plurality of even LSLs gated by MS1. The gates of these two groups are separated but the source node of these SL-isolation devices, MS0 or MS1, is connected to a common SLs which is cited as CSL.

In FIG. 14a shows there are only two rows of SL-isolation devices with their gates connected to odd and even control signals per one Sector. Each Sector has 8 preferable blocks. During the PC period, all odd and even local BLS and local SLS are preferably pre-charged to PIV. As a consequence, the CSL and SLG[0] and SLG[1] are coupled to 6V, 8V and 8V respectively with all BL-selected transistors, MG, are biased in off-state by coupling all GBLs to VDD and gate of BLG voltage to VDD as well.

During the preferable PC cycle, the 6V of PIV comes from CSL through odd and even SL-isolation devices, MS0 and MS1, to all LBLs and LSLs of the selected block of the selected Sector and would not leaked away to GBLs because all BL selected transistors, MG, remain in the shut-off state due to their gates and Drain are tied to same voltage of VDD. This PC time is subject to the capacitance of each LBL and LSL. In this HiNOR array, it is preferable to have total 256 WLs in 8 blocks within the same Sector. Thus each Sector had short LBL and LSL capacitances which are less than 0.2 pf. As a result, the PC time to charge all LBL and LSL from 0V or VDD to PIV of 6-7V for the selected one Sector is aimed to be less than 5 uS-10 uS.

In order to reduce the program disturbance to the remaining seven unselected blocks in the selected Sector, the WLs' voltage of the unselected blocks is biased to a voltage, ranging from 3V to 6V. The reason to apply 3V-6V to the unselected WLs is because the Inhibit BLs' voltage is 6.0V. If the 3.0V is used in which is ½ of PIV, then the program-Inhibit LBL and LSL disturbance (BLD and SLD) to the unselected HiNOR paired cells are equally divided. The BLD is reduced 3V because the voltage drop between unselected HiNOR cells' drain and gate is 3.0V. Similarly, the WL disturbance is 3V on the selected cells with channel biased at 0V in the selected page. But if the WL voltage of the unselected HiNOR cells is biased at 6V, the BLD to the unselected HiNOR cells in the unselected BLs is reduced to zero. On the contrary, the WL-disturb to the selected HiNOR cells in the selected BL and page becomes large of 6.0V from Poly2-gate to cells' channel. But since HiNOR channel FN program needs to have about 20V between channel and poly2-gate, thus 6.0V of WL-disturb during the short page program time can be accepted.

At the end of $1^{st}$ PC cycle period, the on-chip charge-pump is preferably remaining active so that the PIV can be well maintained in all LBLs and LSLs of the Selected Sector and blocks. After $1^{st}$ PC cycle, now the program operation will be immediately moved to the $2^{nd}$ cycle which is cited as Data Setting Period, DSP.

FIG. 14b shows an embodiment of the preferable voltage biased conditions assigned to the WLs, LBL, LSL, GBL, BLG, SLG pairs and CSL, TPW and DNW of the Selected block and the remaining unselected blocks within a typical HiNOR memory Sector during the $2^{nd}$ cycle of the Data settling period. This cycle has to be performed in unit of a half-page Program operation of the present disclosure.

As explained in FIG. 14a, all LBLs and LSLs are pre-charged to PIV during the $1^{st}$ PC cycle. That means in the beginning of the $2^{nd}$ cycle, all LBLs and LSLs are still maintained at PIV which is set to be around 6V when pump is held active. Now the half-page program operation of the HiNOR is followed. In this $2^{nd}$ cycle, the GBL voltage in each GBL is coupled to either VDD and VSS as set in the $1^{st}$ cycle. The GBL voltage set to be 0V is selected for programming the cells in the selected page, while the GBL voltage set to be VDD is selected for un-program as explained above.

Since all LBLs and LSL are held at same PIV in the beginning of this $2^{nd}$ cycle by the help of the voltage equalizer devices of MP, thus the selected LBL and LSL for program have to be discharged to 0V through the selected divided BL devices, MG, with gate tiled to VDD along with the selected GBLs are set to be 0V by the data pattern stored in the LV SA and PGM buffer from external pins of the present disclosure. But in order to discontinue the leakage to the 0V GBL, the corresponding LSL connected to the pump of 6.0V has to be disconnected. As a consequence, the gates of all HiNOR transistors connected to SG[1] are coupled to 0V so that all the selected LBL would be pulled to 0V and non-selected BL would be kept 6.0V in half-page without placing any current loading on the pump.

One the contrary, another half-page is still held at 6.0V because the gates of all SG[0] are still coupled to 8V and SCL is still held at 6V. Since each selected LBL is sandwiched by two adjacent unselected LBLs which are held at 6V, so that the selected BLs voltage would not pulled to low due to coupling effect of the discharge. As a result, the one half-page program can be performed without errors, according to the data pattern stored in the LV SA and PGM buffer. Now the completion of the $2^{nd}$ cycle, all half-page cells in the selected page would have the right program LBL voltage of 0V and right program-Inhibit LBL voltage of 6-7V ready for the $3^{rd}$ cycle of program operation.

FIG. 14c shows a preferable set of voltage biased conditions assigned to the WLs, GBL, BLG, SLG pairs and CSL, TPW and DNW of the Selected block and the remaining unselected blocks within a typical HiNOR memory Sector during the $3^{rd}$ cycle of the Program period of the preferable half-page Program operation of the present disclosure. In this $3^{rd}$ half-page program cycle, +20.0V of program WL voltage is achieved by ramping the selected WL voltage from the initial about 8-10V to the final 20V for the accurate half-page program of the present disclosure. For good control over the NAND cells' Vt in the selected half-page, the selected gate voltage can be gradually increased one pulse by one pulse. The program operation practically is an iterative process. The program time spec is being divided into around 10 pulses with each pulse set to be around 20-25 uS. Whenever the half-page program is performed, a half-page program verification will be performed subsequently. The process will be repeated until the all bits are in half-page being successfully programmed. Then the next half-page program steps will be repeated from FIG. 14a through FIG. 14d until the whole page data is correctly programmed without errors.

FIG. 15 shows a typical set of preferable voltage biased conditions assigned to the WLs, BLs, CSLs and SGs, TPW and DNW of the Selected block and the remaining unselected blocks within a typical NAND memory Sector during the Read operation of the present HiNOR disclosure.

During read operation, the equalizer devices have to be kept shut off by grounding the gates of isolation devices (MP) devices. Thus LBL and LSL would be isolated first.

The SL-isolation transistors, MS0 and MS1, have to be kept always in on-condition by connected their gates either VDD or HV as high as 20V to reduce their resistance for fast read speed and CSL has to be coupled 0V for correct read operation.

The gates of selected Divided Block transistors MG have to be coupled to VDD to ensure the current flow path can flow from SA to Selected GBL through MG, LBL to LSL to ground through SL-isolation device Ms0 or MS1.

The WL voltage assignments are two for the paired gates of each HiNOR 2 T cell, Ma and Mb, which are connected in series. The selected WL voltage in the selected page (WL) is preferably coupled to VDD of the selected HiNOR 2 T cell. But the unselected HiNOR transistor act as a pass-transistor of the selected 2 T HINOR cell to be coupled with a much higher voltage than VDD, which is set to be around 5V for this disclosure.

The GBL voltage assignment in read operation is set to be below 1.0V as defined in regular NVM design. The GBLs are selected to connect to SAs. The number of SAs can be 8, 16 or 32, depending the specs and trade off of read access time and power-consumption. The SA design is based on LV current sensing scheme for faster access speed. In 1 Gb NOR flash spec, the random read legacy, tacc, is set to be around 100 nS in unit of byte or word.

In HiNOR design, the two SLC Vt assignments of Mb and Ms are Vt0 and Vt1. The Vt0 is defined with a preferable center value to be +0.7V to 1.0V, while the Vt1 center value is set to be around 2.0-2.5V with a tight Vt0 and Vt1 distribution of 0.5V as seen in many MLC NAND's programmed Vts.

FIG. 16 is a schematic block diagram of a typical HiEE memory array of the present disclosure. The HiEE array comprises a plurality of 2 T EEPROM cells formed in a matrix that has N pairs of rows such as memory cells' rows tied to a plurality of WLs, such as WL[1]-WL[N] and memory cells' select transistor rows tied to a plurality of signals such as SG[1]-SG[N]. Like today's EEPROM, APlus HiEE array comprise a plurality Flotox-based EEPROM 2 T cells formed into a matrix. With common drains of 2 T cells connected to N bytes of BLs such as BLN[0]-BLN[7] and each byte has eight BLs, BL[0]-BL[7] and one row comprising of NMOS HV SL-Isolation transistors.

The BLs are connected to a VPP HV power supply of around 15V through a BL-Isolation device, 1-poly HV NMOS device, MP with gate controlled by the HV level shifter and LV Byte-register in LV page buffer. The read operation of HiEE is to access the selected byte of 8 bits through Y-pass gate transistors to Sense Amplifier.

X-decoder is used to provide the program and erase HV of 15V to the selected WLn and SGn. Like EEPROM, HiEE cell uses the same erase scheme to perform both low-current FN tunneling effect. The erase Vt is cited as Vt1 and set to be around +2.0V, while the programmed Vt is Vt0, which is set to be around −2.0V.

Note, EEPROM cell's Vt is opposite to NAND and HiNOR. HiEE erased Vt1 is to have a higher Vt for non-conduction state, while the program state of Vt0 is the conduction state. The write operation of HiEE is like EEPROM to be split into two steps. The $1^{st}$ step is the erase operation and is followed by the program operation. The whole write operation is automatically controlled by the on-chip state machine. The popular EEPROM densities range from 2 kb to 1 Mb in 2011.

HiEE sets to have high 1M endurance cycles in unit byte as a byte-alterable data storage as today's EEPROM specs. The VDD operating voltage, ranges from 1.8V to 5.5V with the Write time of around 1 mS. The disadvantage of today's EEPROM design is to have a HV PGM buffer. Particularly, EEPROM PGM buffer is relatively the largest one in all memory as compared to NAND, NOR and other flash memories. Why? It is because all the program BL voltage requires up to 15V, while NAND is VDD and NOR is around 6.0V for CHE program. The 15V BL HV for program in BLs results in the larger device and latches in both PMOS, NMOS, and isolation BL devices. Now, this HiEE novel program scheme is to change this by using the LV small and compact PGM page buffer as used in today's NAND or Aplus' HiNAND and HiNOR approaches disclosed above. As a result, a large silicon area can be saved for cost reduction, particularly for low-density EEPROM parts.

FIG. 17 shows a typical set of preferable voltage biased conditions assigned to the WLs, BLs, CSLs and SGs of the select and the remaining unselected EEPROM cells of a typical HiEE memory chip during the similar FN channel erase operation but is performed in units of byte of the present disclosure.

FIG. 18 shows a typical set of preferable voltage biased conditions assigned to the WLs, SGs, BLs and Gate of MP of the HiEE array during low-current FN channel erase operation of the present disclosure.

In order to be consistent with HiNAND and HINOR approach of this disclosure, the HIEE erase operation is to decrease cell's Vt to Vt0, which is a negative state of around −2.0V as oppose to the today's EEPROM's erased state of Vt1, which is a positive state with a value of around +2.0V. Therefore, the gates or WLs of the cells, MC, of the selected byte or page of 2 T HIEE cells have to be coupled to 0V, and the channels of MC have to be coupled to highest VPP of around 12-15V through select transistor, MD, from the selected BLs of the selected byte or page. The selected BLs have to be coupled to a voltage greater or equal to VPP-Vt, of which Vt is the threshold of the MD. VPP-Vt is around +12.0V-14.0V.

In order to fully pass VPP-Vt to the channels of the selected cells of MC, the gates of selected MD has to be coupled to VPP. The unselected 2 T cells' gates of MD have to be coupled to 0V or VDD to block VPP-Vt in BL from passing into the non-selected EEPROM cells of MCs. The remaining WLs of unselected EEPROM cells are held to 0V to avoid any WL and BL disturb during the erase operation.

Since the selected flash cells' channels have to be coupled to VPP-Vt, the voltage must come from somewhere in chip.

In today's EEPROM, the HV of VPP or VPP-Vt comes from HV PGM buffer. But in this HiEE design, LV PGM buffer is used for saving silicon area, thus HV of VPP-Vt has to come from other source. In FIG. 18, the VPP-Vt voltage charge comes from VPP line that is coupled to the source node of BL-isolation device of MP. In FIG. 18, the gate and source nodes of MP are coupled to VPP during the preferable erase operation of this disclosure. As a result, a VPP-Vt of around 14V-16V is produced and coupled to all BLs in EEPROM cell array as seen in FIG. 18.

To erase all pages in the whole HIEE array, the same BL and gates of MP and gates of MD remained the same except all WLs have to be coupled to 0V, not just one row or one page. This is usually called as a chip erase of today's EEPROM.

Since the EEPROM cells uses low-current FN tunneling scheme like HINOR and HINAND and NAND, thus the chip and page erase is pretty much the same and is around 1 mS. After chip erase, all 2 T HiEE cells' Vt becomes Vt0 of −2.0V simultaneously. As a result, there is no need of any HV PGM buffer in this operation but need an on-chip VPP charge pump to generate VPP to the common SL.

FIG. 19, FIG. 20 and FIG. 21 show three similar key low-current FN sub-program cycles of the HiEE array of the presentation like HiNAND's and HiNOR's program operation described previously in this application to reduce the on-chip charge-pump silicon area and power consumption.

In FIG. 19, it shows the preferable set of biased voltage conditions on the WLs, BL, SL and Select-gate line of the selected and unselected pages of HiEE.

During the $1^{st}$ program cycle, which is similarly cited as Pre-charge period (PC), the PC cycle has to be performed in unit of single, multiple or single half-page of the present HiEE disclosure. The pre-charge HV comes from VPP line on common SL as seen in FIG. 19 by applying VPP to both source node CSL of MP and gate of MP.

In FIG. 19 during the preferable PC cycle, VPP-Vt comes changed to VPP-Vt voltage.

At the completion of the PC cycle, all BLs would be charged up to VPP-Vt within 5-10 usec from CSL through odd and even SL-isolation devices, MS0 and MS1, to all LBLs and LSLs of the selected block of the selected Sector and would not leaked away to GBLs because all BL selected transistors, MG, remain in the shut-off state due to their gates and Drain are tied to same voltage of VDD. This PC time is subject to the capacitance of each LBL and LSL. In this HiNOR array, it is preferable to have total 256 WLs in 8 blocks within the same Sector. Thus each Sector has short LBL and LSL capacitances which are less than 0.2 pf. As a result, the PC time to charge all LBL and LSL from 0V or VDD to PIV of 6-7V for the selected one Sector is aimed to be less than 5 uS-10 uS when there are no other leakage paths existing in all BLS and SLs.

Unlike previous HiNNAD and HiNOR, there is no BL disturbance to the EEPROM cells of MC because the protection of the select HV NMOS transistor of MD in each 2T HiEE cell.

At the end of $1^{st}$ PC cycle period, the on-chip charge-pump is preferably remaining active so that the PIV can be well maintained in all LBLs and LSLs of the Selected Sector and blocks. After $1^{st}$ PC cycle, now the program operation will be immediately moved to the $2^{nd}$ cycle which is cited as Data Setting Period, DSP.

FIG. 20 shows an embodiment of the preferable voltage biased conditions assigned to the WLs, BL, gates of divided BL and SL-isolation device. This operation is performed in half-page. The pre-charged VPP-Vt voltage would be selectively discharged to 0V through page-buffer if the corresponding bits of Page-buffers store "0" and remain VPP-Vt if store "1."

FIG. 21 shows a preferable set of voltage biased conditions assigned to the WLs, BL, SL and SG of the selected page and the remaining unselected pages within a typical HiEE memory chip during the $3^{rd}$ cycle of the Program period of the preferable half-page Program operation of the present disclosure.

In this $3^{rd}$ half-page program cycle, +15.0V of program WL and BL voltage is required in this half-page program of the present disclosure. After program, the cell's Vt would be increased to Vt1 or stays with Vt0, depending on the stored data pattern in the LV PGM buffer of this HIEE chip.

FIG. 22 shows a typical set of preferable voltage biased conditions assigned to the WLs, BLs and CSL and SG of the Selected byte and unselected bytes in the selected and unselected pages of HiEE chip during the Read operation of the present disclosure.

Summarizing, a low-current FN channel, Program, Program-Inhibit and Read operations is disclosed for any flash memory using FN-tunneling scheme for program and erase operation, without regard to NAND, NOR, and EEPROM and regardless PMOS or NMOS non-volatile cell type as long as any Non-volatile cell uses FN-tunneling for both program and erase operations, then the method disclosed can use the LV page-buffer.

In other words, as long as there is no VDS current flow between Non-volatile's Drain and Source nodes in both Erase and Program operation of Non-volatile cell, then the present disclosure to supply the Program-Inhibit (PI) voltage from SL not from BL can allow us to use a LV Page buffer.

For FN-channel program low-current program and erase operations, a LV Page buffer is preferably used for the present invention.

While the disclosure has been particularly shown and described with reference to the preferred embodiments thereof, it will be understood by those skilled in the art that various changes in form and details may be made without departing from the spirit and scope of the disclosure.

What is claimed is:

1. A method to achieve savings in silicon area and reduced power consumption for nonvolatile memories, comprising the following steps:

(1) providing a memory array of non-volatile memory cells, wherein said non-volatile memory cells use Fowler-Nordheim (FN)-tunneling for both program and erase operations, wherein the memory array is a non-volatile NAND memory array, wherein the NAND array is divided in memory blocks, wherein each block comprises N NAND strings, wherein N is an integer number N≥1, wherein each NAND string comprises X NAND transistors connected in series with only one scalable select-gate transistor located on top of the string, wherein X is an integer number X≥1, wherein the select-gate transistor is of the same transistor type as the X NAND transistors, wherein each block has just one common source line, and wherein the NAND array has N sets of separate N bit lines (BL) and N source lines (SL) along with X word lines (WL) and only one select gate (SG) line, and wherein a page program operation in the NAND array is performed in unit of half page and the whole program cycle is divided into 3 sub-cycles wherein a program inhibit voltage (PIV) in unselected BLs in a selected page of a selected block is generated from an on-chip charge-pump circuit and is supplied to a common node of common source line (CSL) and the PIV is forwarded to a unselected BL in the selected page to avoid undesired program operation; and (2) enabling a low voltage (LV) page buffer by supplying a Program-Inhibit voltage (PIV) a from source line (SL) voltage.

2. The method of claim 1 wherein the number X equals 32.

3. The method of claim 1 wherein the NAND array is divided in a number of sectors wherein each sector comprises Y NAND memory blocks with one high voltage isolation device per each bit line on top of the block and each source line on bottom of the block, wherein Y is an integer number Y≥1, wherein each sector has its own common source line, and wherein the gate of the bit line isolation devices are connected by one common bit line group (BLG) signal but the gates of source line-isolation devices are being divided into two groups such as the even source lines and odd source lines are connected to a first signal line group SG0 or respectively to a second signal line group SG1 of a pair of signal line groups.

4. The method of claim 3 wherein the number Y is eight.

5. The method of claim 4 wherein in each sector are N local source lines, N local bit lines, and N global bit lines connected to top metal layers.

6. The method of claim 3 wherein two sectors share one common source line (CSL) running in X-direction generated from an X-decoder, which has one common CSL input connected to a charge pump generating a Program Inhibit voltage to selected local bit lines and source lines of a selected sector by turning on a corresponding select gate.

7. The method of claim 3 wherein an erase operation of a selected memory block of a memory sector of the NAND array comprises the steps of:
  decreasing threshold voltage Vt of selected non-volatile cells of the selected memory block below −2V after a FN erase operation, wherein all word lines (WL) of the block selected have to be coupled to 0V while all WLs of other non-selected blocks are kept floating, wherein the NAND cells in the selected block get erased when a common triple P-well is coupled and ramped to +20V against the WL voltages and wherein after the erase operation a threshold voltage Vt of all NAND cells is below −2V;
  verifying erase operation, wherein gates of other transistors formed in a same selected sector but outside the selected block are left floating in order to protect these transistors.

8. The method of claim 7 wherein in order to erase remaining blocks of the selected sector the erase method can be repeatedly applied and the same threshold voltage Vt is achieved after the erase operation.

9. The method of claim 7 wherein the threshold voltage Vt of the top select transistor of a block to be erased is kept unaltered and thus its gate voltage is kept floating as the unselected word lines in the unselected Blocks in the selected Sector.

10. The method of claim 7 wherein in a very beginning of the array erase operation, gates of Select transistors (SG) of the selected blocks are coupled to 0V to get erased in a $1^{st}$ erase cycle of the selected Block, after the $1^{st}$ erase cycle a Vt voltage of the selected SG transistor is erased to −2.0V, after that a page program operation particularly reserved for SG transistor page is performed subsequently after erase wherein the Vt voltage of SG transistor is programmed to a positive Vt voltage value, ranging from 0.7V to 1.0V for a low-voltage 1.8V VDD operation, wherein after that, the gate voltage of SG transistors remain floating to ensure no disturbance happens by subsequent block erase operation and program operation.

11. The method of claim 1 wherein said PIV is forwarded through decoders.

12. The method of claim 1 wherein a first sub-cycle is a pre-charge (PC) cycle, which performed in the unit of half-page, wherein during the PC period all odd and even local BLs and local SLs are pre-charged to PiV, the CSL and gates of the SL isolation devices (SG) lines are coupled to 6V and 8V respectively while all BL-selected transistors are biased in off-state by coupling all global bit lines (GBL) to VDD and gate of bit line group (BLG) voltage to VDD as well.

13. The method of claim 12 wherein the WLs voltages of unselected blocks are biased to a voltage, ranging from 3V to 6V.

14. The method of claim 1 wherein right after the $1^{st}$ sub-cycle a second sub-cycle, a data setting period, which is performed in unit of a half page, is started, wherein the GBL voltage in each GBL is coupled to either VDD and VSS as set in the $1^{st}$ cycle and the GBL voltage set to be VSS is selected for programming the cells in the selected page, while the GBL voltage set to be VDD is selected for un-program.

15. The method of claim 13 wherein all LBLs are held at PiV in the beginning of this $2^{nd}$ cycle, thus the selected LBL for program is discharged to 0V through a selected BL-isolation device when the selected GBL is set to be 0V by the data pattern stored in the LV sense amplifier (SA) and in a PGM buffer from external pins, wherein in order to discontinue the leakage to the 0V GBL, the corresponding LSL connected to the pump of 6.0V has to be disconnected and the gates of all NAND transistors connected to SG[1] are coupled to 0V so that all the selected LBL would be pulled to 0V and non-selected BL would be kept 6.0V in half-page without placing any current loading on the pump, wherein at the completion of the $2^{nd}$ cycle, all half-page cells in the selected page would have the right program LBL voltage of 0V and right program-Inhibit LBL voltage of 6V ready for the $3^{rd}$ cycle of program operation.

16. The method of claim 1 wherein in the $3^{rd}$ half-page program sub-cycle +20.0V of program WL voltage is achieved by ramping the selected WL voltage from an initial about 8-10V to the final 20V for the accurate half-page program, wherein the selected gate voltage can be gradually increased by one pulse after another pulse, wherein the program operation is an iterative process wherein a program time specification is being divided into about 10 pulses with each pulse set to be around 20-25 us and whenever the half-page program is performed, a half-page program verification will be performed subsequently wherein the process will be repeated until the all bits are in half-page being successfully programmed followed by a next half-page program steps until the whole page data being correctly programmed without errors.

17. The method of claim 1 wherein a read program operation is performed by coupling a pass-gate voltage of about 6.0V to non-selected WLs in the selected string and both SL-isolation devices have to be held in conduction state with gate voltage coupled to VDD along with SCL held at 0V and top GBL and LBL selected transistors' gates are also coupled to VDD to be on conduction state for read sensing.

18. A system to achieve savings in silicon area and reduced power consumption for nonvolatile memories, comprising:
  a memory array of non-volatile memory cells wherein said non-volatile memory cells use Fowler-Nordheim (FN)-tunneling for both program and erase operations, wherein the memory array is a non-volatile NAND memory array, wherein the NAND array is divided in memory blocks, wherein each block comprises N NAND strings, wherein N is an integer number N≥1, wherein each NAND string comprises X NAND transistors connected in series with only one scalable select-gate transistor located on top of the string, wherein X is an integer number X≥1, wherein the select-gate transistor is of the same transistor type as the X NAND transistors, wherein each block has just one common source line, and wherein the NAND array has N sets of separate N bit lines (BL) and N source lines (SL) along with X word lines (WL) and only one select gate (SG) line and wherein the array is capable of performing a page program operation in the NAND array in unit of half page, wherein the whole program cycle is divided into 3 sub-cycles, wherein a program inhibit voltage (PIV) in unselected BLs in a selected page of a selected block is generated from an on-chip charge-pump circuit and is supplied to a common node of common source line (CSL) and the PIV is forwarded to a unselected BL in the selected page to avoid undesired program operation; and a low voltage (LV) page buffer configured to supplying a Program-Inhibit voltage (PIV) a from source line (SL) voltage.

19. The system of claim 18 wherein the number X equals 32.

20. The system of claim 18 wherein the memory array is a non-volatile NOR array based on NAND-cell and process, which is divided in sectors, wherein each NOR sector is divided in Y memory blocks, wherein Y is an integer number Y≥1, wherein each block comprises a plurality of NOR basic cells of 2 T floating-gate NAND cells formed in matrix with their paired gates connected to X WLs, wherein X is an integer number Y≥1, one row of top Divided BL high-voltage (HV) NMOS devices, gated by a horizontal line of bit line group (BLG), two rows of SL-Isolation HV NMOS devices gated by a pair of signals of a first signal line group (SLG[0]) and a second signal line group (SLG[1]) running in parallel to WLs in x-direction and one row of equalization HV NMOS devices gated by a PGM_SEL signal, wherein each column of NOR cell array is being configured with one pair of even and odd local bit lines (LBL) and even and odd local source lines (LSL) running vertically in parallel with respective metals in Y-direction.

21. The system of claim 20 wherein the number X equals 32.

22. The system of claim 20 wherein the number Y equals 8.

23. The system of claim 18 wherein the memory array is a non-volatile EEPROM array comprising a plurality of EEPROM cells formed in a matrix that has N pairs of rows, wherein N is an integer number N≥1, such as memory cells' rows tied to a plurality of N WLs and N memory cell select transistor rows tied to a plurality of N signals, wherein the common drains of the memory cells are connected to N bytes of BLs and each byte has eight BLs and one row comprising of NMOS HV SL-Isolation transistors, wherein the BLs are connected to a positive potential (VPP) HV power supply of around 15V through a BL-Isolation device with gate controlled by a HV level shifter and LV Byte-register in a LV PGM page buffer wherein a read operation of the EEPROM accesses a selected byte of 8 bits through a Y-pass gate to a Sense Amplifier.

* * * * *